(12) United States Patent
Swoboda

(10) Patent No.: US 7,209,058 B2
(45) Date of Patent: Apr. 24, 2007

(54) TRACE RECEIVER DATA COMPRESSION

(75) Inventor: Gary L. Swoboda, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/383,290

(22) Filed: May 15, 2006

(65) Prior Publication Data

US 2006/0255972 A1 Nov. 16, 2006

Related U.S. Application Data

(60) Provisional application No. 60/681,427, filed on May 16, 2005, provisional application No. 60/680,624, filed on May 13, 2005.

(51) Int. Cl.
*H03M 7/46* (2006.01)

(52) U.S. Cl. .......................................... 341/63; 714/45

(58) Field of Classification Search .................. 341/63; 714/45

See application file for complete search history.

(56) References Cited

U.S. PATENT DOCUMENTS

| | | | |
|---|---|---|---|
| 6,615,371 B2 * | 9/2003 | McCullough et al. | 714/45 |
| 6,834,365 B2 * | 12/2004 | Bardsley et al. | 714/45 |
| 6,912,675 B2 * | 6/2005 | Swoboda | 714/45 |
| 6,918,065 B1 * | 7/2005 | Edwards et al. | 714/45 |
| 2004/0250164 A1 * | 12/2004 | Ahmad et al. | 714/30 |

* cited by examiner

*Primary Examiner*—Jean Bruner Jeanglaude
(74) *Attorney, Agent, or Firm*—Robert D. Marshall, Jr.; W. James Brady; Frederick J. Telecky, Jr.

(57) ABSTRACT

A method repacks variable width trace data into a different packet length previous to being stored into memory. In order to conserve bandwidth, the trace data may also be compressed during transmission by eliminating the transmission of packets that have the same value.

5 Claims, 9 Drawing Sheets

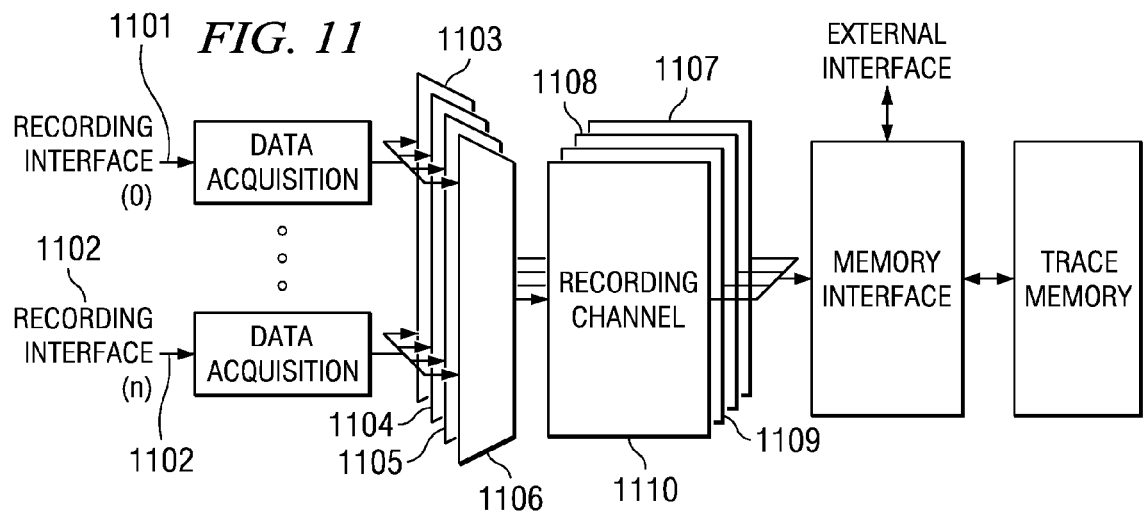
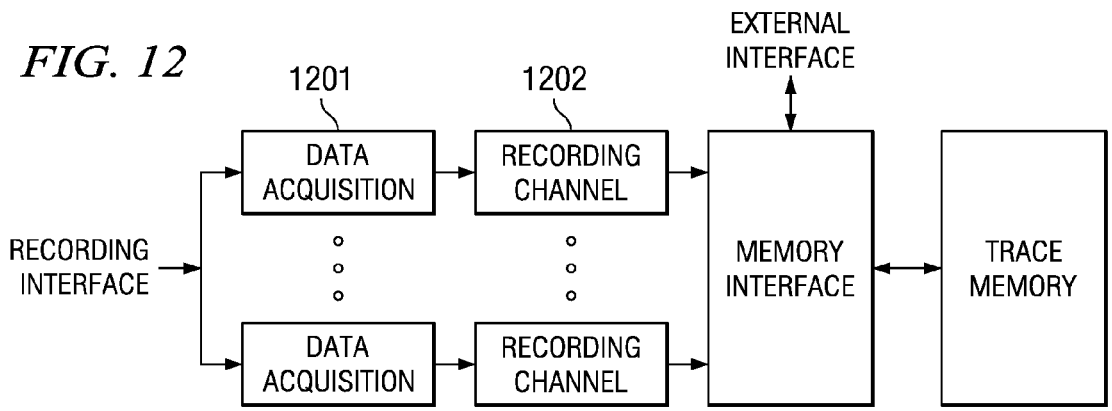
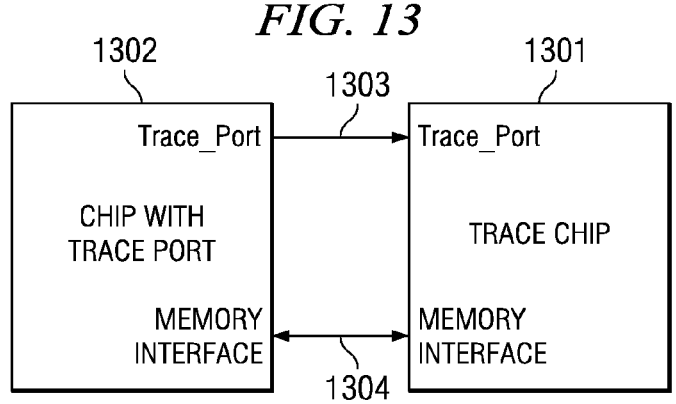

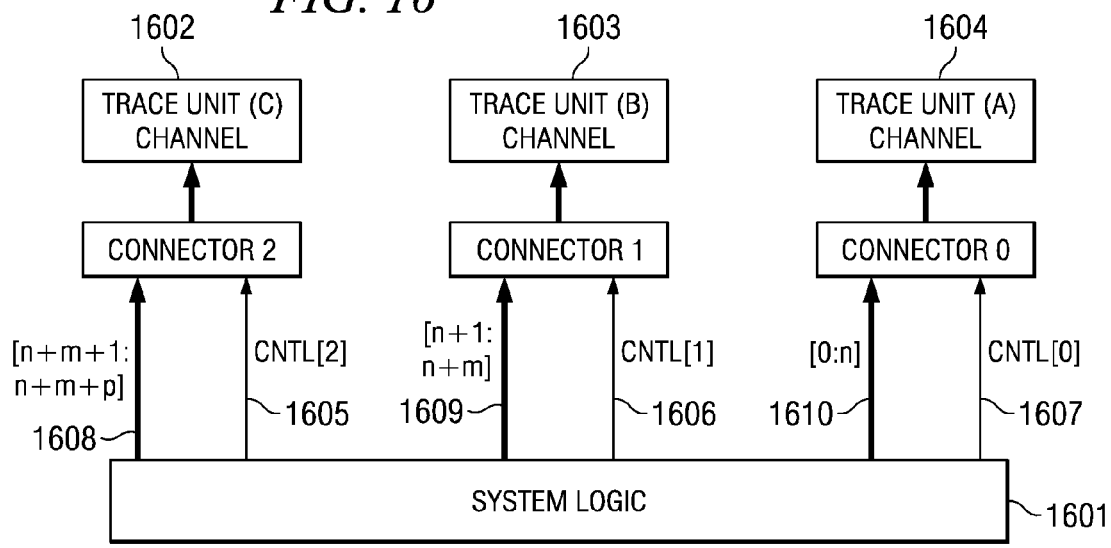
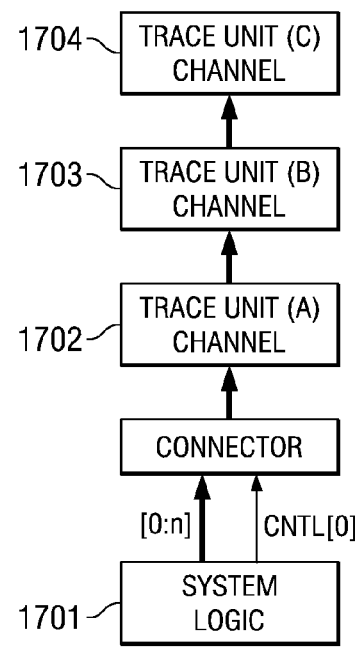
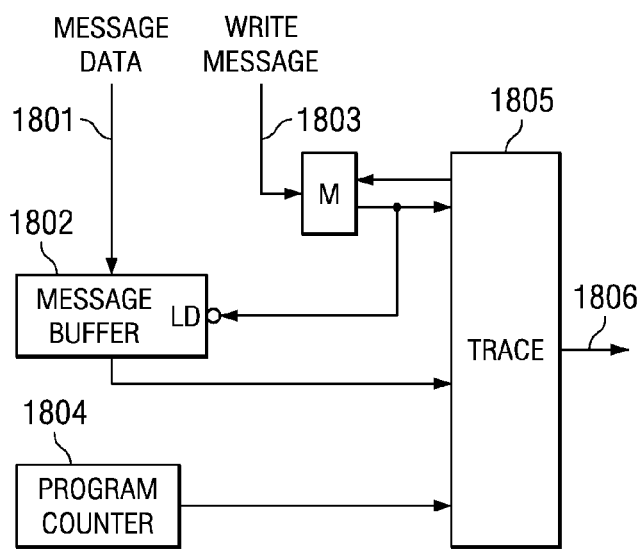

TRACE RECEIVER DATA COMPRESSION

CLAIM TO PRIORITY OF PROVISIONAL APPLICATION

This application claims priority under 35 U.S.C. §119(e)(1) of provisional application Nos. 60/680,624, filed May 13, 2005 and 60/681,427, filed May 16, 2005.

TECHNICAL FIELD OF THE INVENTION

The technical field of this invention is processor and memory emulation technology.

BACKGROUND OF THE INVENTION

During applications code development, the development team traverses a repetitive development cycle shown below hundreds if not thousands of times:
 1. Building code—compile and link a version of applications code
 2. Loading code—loading the code into real hardware system or a software model
 3. Debugging/Profiling code—chasing correctness or performance problems
 4. Making changes—making source code edits, or changing the linker directives The load and change portions of this cycle are generally viewed as non-productive time, as one is either waiting for code to download from the host to the target system or looking through files that need changes and making changes with a text editor.

Any trip through the loop can either introduce or eliminate bugs. When bugs are introduced, the development context changes to debug. When sufficient bugs are eliminated, the development context may change to profiling. There are obviously different classes of debug and profiling, some more advanced than others. Profiling can involve code performance, code size and power. The developer bounces between the concentric rings of the development context, as the applications code development proceeds.

Special emphasis must be placed on getting to the developer the system control, data transfers, or instrumentation applicable to the current debug or profiling context. This requires packaging the system control and instrumentation in readily accessible systems solutions form, where developers can easily access tools with capabilities targeting specific development problems. The presentation of capabilities must expose the complete capability of the toolset while making the selection of right capability for the task at hand straightforward.

The need for emulation has significantly increased with the introduction of cache based architectures. This increased need primarily arises from the fact that on flat memory model architectures such as the Texas Instruments C620x devices, the performance that can be expected from running on the target could be accurately modeled with a simulator. The actual system performance with interrupts and Direct Memory Access (DMA) was within 10–15% of the simulated performance. This margin was reasonable for most applications of interest.

With the introduction of cache based architectures and the inability to model cache events and their impact on system performance accurately, today's developers find simulated performance to be anywhere from 50–100% away from the actual target performance. This inaccuracy results in a loss of confidence about the capabilities of the device and leads to fictitious performance de-rating factors between cache and flat memory performance. While some of the discrepancy between simulated and actual performance is due to inadequate modeling of the cache, there still exists a fundamental problem in modeling system related interactions such as interrupts or DMA accurately. Hence simulators typically have tended to play catch up with the target in modeling the system accurately. The period over which the simulator for a given target matures is unfortunately the same time that a developer is attempting to get to market.

Visibility into what the target is doing is key to extracting performance on cache-based architectures. The way to get this visibility for profiling system performance is through emulation. Visibility is also key for those writing behavioral simulators to countercheck the behavior of the target against what is expected. It is key to software developers in helping to reduce cache related stalls that impact performance. Visibility on the target is invaluable for system debug and development of applications in a timely manner. The absence of visibility leaves software developers with little else but to speculate about the probable reasons for loss of performance. The inability to know what is going on in the system leads to a trial and error approach to performance improvement that is gained by optimal code and data placement in memory. The lack of proper tools that allow for cache visualization precludes one from answering the question "Is this the most optimal software implementation for this target?" The ability to know if a given software module ever missed real-time in an actual system is of utmost importance to system developers who are bringing up complex systems. Such questions can be only accurately answered by the constant and non-intrusive monitoring of the actual system that advanced emulation offers.

Visibility is key in aiding complex system debug. Debugging memory corruption and being able to halt the CPU when such a corruption is detected is of primary importance, as memory exceptions are not currently supported on Texas Instruments C6x targets. In addition on the C6x Digital Signal Processor (DSP) data memory corruption can also result in program memory corruption causing the CPU execution to crash, as program and data share a unified memory. There is therefore a need to accurately trace the source code that is causing this malicious behavior. The ability to monitor Direct Memory Access (DMA) events, their submissions and completions relative to the CPU will provide additional dimensions to the programmer to tune the size of the data sets the algorithm is working on for more optimal performance. The ability to catch and warn users about spurious CPU writes or DMA writes to memory can prove to be invaluable in cutting down the software debug time. Advanced emulation features once again hold the key to all these critical capabilities. The need for good visibility only gets more serious with the introduction of multiple CPU cores moving forward. The need to know which CPU currently has access to a shared common data resource will be a question of prime importance in such scenarios. The detection and warning of possible memory incoherence is another critical capability that emulation can offer.

The new emulation features will provide enhanced debug and profiling capabilities that allow users to have better visibility into system and memory behavior. Further, several usability issues are addressed.

The aim is to make new debug and profiling capabilities available and fix problems encountered in previous implementations:
 Stall cycle profiling to identify parts of the user application that requires code optimization.

Event profiling to analyze system and memory behavior which in turns allows to choose effective optimization methods.

Cache viewer and coherence analysis to debug cache coherence problems.

Software Pipelined Loop instruction (SPLOOP) Debug.

Support for Memory protection and security

Reduce Real-time Data Exchange intrusiveness.

Richer set of Advanced Event Triggering events.

SUMMARY OF THE INVENTION

A trace data source may output trace packets in a width that is not native to the packet. For example, 8 10-bit trace packets may be transmitted as 10 8-bit transmission packets. The trace recording format also accommodates compression of consecutive segments or groups of trace segments. In the simplest case, when at least two consecutive trace words are the same value, the words 2 through n are replaced with a command and count that communicates how many times the word was repeated. The maximum storage for a burst of 2 through n words is two words.

BRIEF DESCRIPTION OF THE DRAWINGS

These and other aspects of this invention are illustrated in the drawings, in which:

FIG. 11 shows a multi input recording interface;

FIG. 12 shows an alternate implementation of a multi input recording interface;

FIG. 13 shows chip and trace unit interconnections;

FIG. 16 is a distributed width trace receiver;

FIG. 17 is a flow diagram of a distributed depth trace receiver;

FIG. 18 shows message insertion into the trace stream;

DETAILED DESCRIPTION OF PREFERRED EMBODIMENTS

Trace data is stored in trace memory as it is recorded. At times, the trace data may be repetitive for extended periods of time. Certain sequences may also be repetitive. This presents an opportunity to represent the trace data in a compressed format. This condition can arise when certain types of trace data are generated e.g., trace timing data is generated when program counter (PC) and data trace is turned off and timing remains on.

Figure 1:
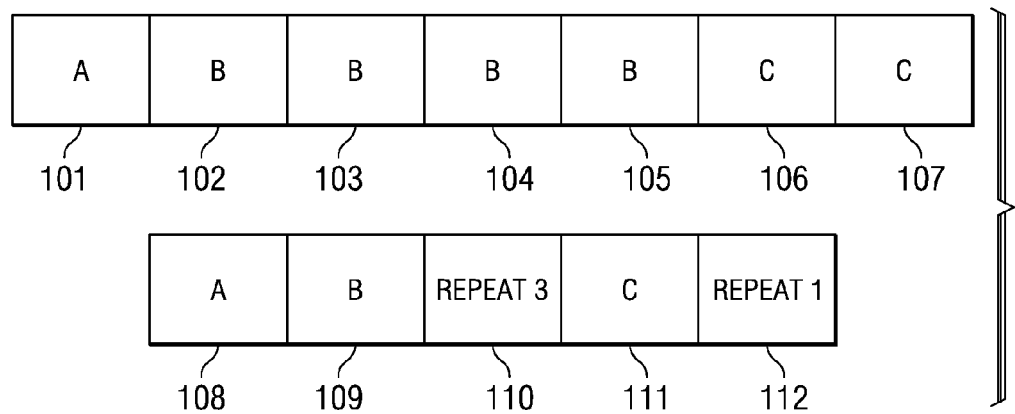
FIG. 1 shows compression of trace words.

The trace recording format accommodates compression of consecutive trace words. When at least two consecutive trace words are the same value, the words 2 through n are replaced with a command and count that communicates how many times the word was repeated. The maximum storage for a burst of 2 through n words is two words as shown in FIG. 1, where word 101 does not repeat, words 102, 103, 104 and 105 are identical and then words 106 and 107 are identical. This sequence compresses as follows—word 108 is the same as word 101, word 109 has the value of word 102, and word 110 contains a 3 as the repetition factor for word 109. Similarly, words 106 and 107 are identical, and are encoded as word 111 containing the value of word 106 while word 112 contains the repetition factor of 1.

Figure 2:
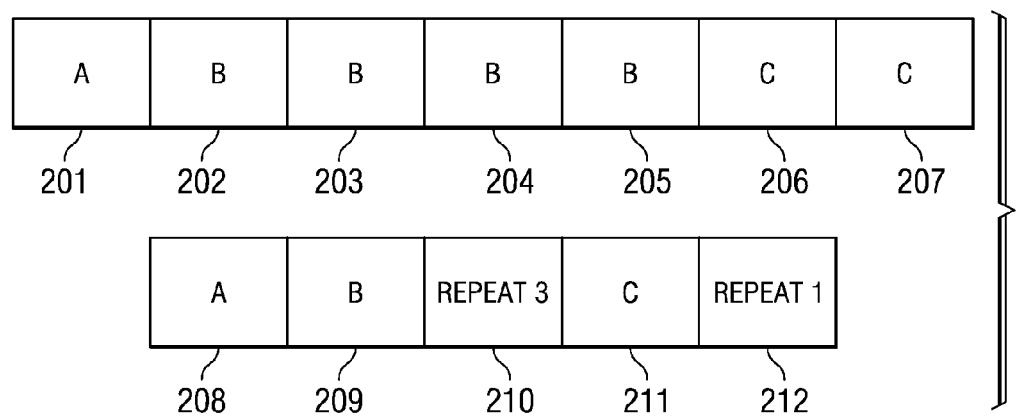
FIG. 2 shows compression of trace packets.

This concept may be extended to data of any width before it is packed into words. In this case packets or packet patterns (sequences) may be recorded in compressed form. It is not necessary for the packets or patterns to be word aligned. This is shown in FIG. 2, where packet 201 does not repeat, packets 202, 203, 204 and 205 are identical and then packets 206 and 207 are identical. This sequence compresses as follows—packet 208 is the same as packet 201, packet 209 has the value of packet 202, and packet 210 contains a 3 as the repetition factor for packet 209. Similarly, packets 206 and 207 are identical, and are encoded as packet 211 containing the value of packet 206 while packet 212 contains the repetition factor of 1. Data recording of single ended signals may use two out of phase clocks to extract the data to substantially lessen the effects of duty cycle distortion. Using of two out of phase clocks makes the data extraction logic considerably more tolerant of the input duty cycle distortion induced by any component (on-chip or off chip) before the data is extracted from the transmission at the receiver.

The use of two clocks, hereafter called BE_BP mode (both edges, both phases), deals with the duty cycle distortion created by circuitry between the transmitter and receiver. If certain factors distort the waveform, the duty cycle could be as poor as 80%/20% by the time the data reaches the capture circuit.

Data from both a positive edge sample and negative edge sample are used to derive the data bit value stored in a circular buffer in BE_BP mode. The primary and secondary clocks capture two copies of the data. A sample is taken with the positive edge of one clock and the negative edge of the other clock during each bit period. These two captured data values are combined to create the data bit value (along with the data value captured by the previous negative edge). The captured data is clocked into the circular buffer based on the clock edges sampling the data.

BE_BP delivers better bandwidth by utilizing the fact that signals switching in the same direction will have similar distortion characteristics. This is best understood by following an example. Beginning with a data bit that is a zero for multiple bit periods, the data moves to a one. Assuming there is distortion in the duty cycle, the rising edge of the data input has similar characteristics to the rising edge of the clock moving high at the bit period where the data bit moves to a one. Since the bit is a zero previously, the data sampled by the clock that is rising used to define the next data bit. Once the data bit is a high, the falling edge of the clock moving low at the bit period where the data bit moves to a zero is used to determine the bit value. The data extraction algorithm is defined by the following equation:

if (last bit==0){data=data sampled by next rising edge clock;} else{data=data sampled by next falling edge clock;}

When a bit is sampled as a one by the positive and negative edges of the clock, the data is assumed to be a one. If the data sampled by the positive edge indicates a one while data sampled by the negative edge indicates a zero, the bit timing is close or the waveform is distorted. In this case the data sampled by the previous bit's negative edge is checked. If this data was captured as a zero, the data for this bit is declared a one because the data bit must be transitioning from a zero to a one. The converse is also true.

Figure 3:
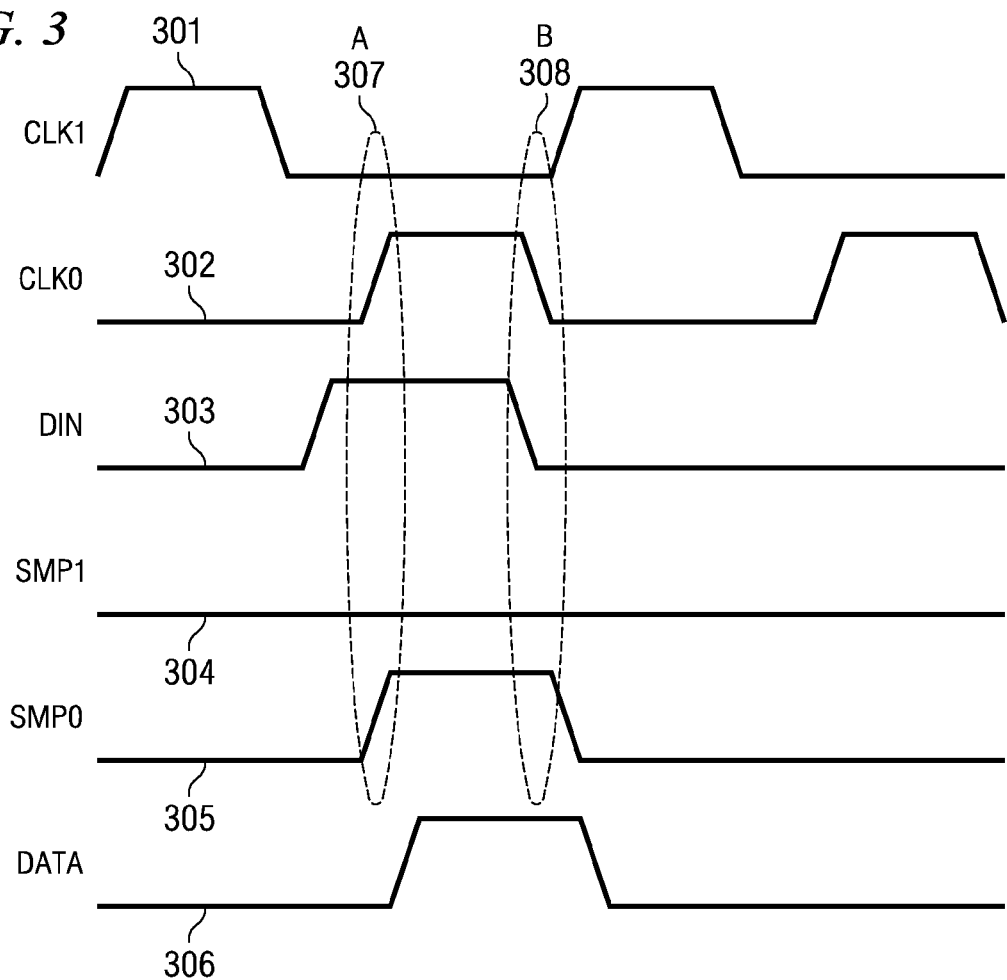
FIG. 3 demonstrates data extraction.

Looking at FIG. 3, one can see how data extraction works. As the equation above shows, data extraction is based on the last data bit extracted at 306 (DATA), data in 303 (DIN), and two clocks that are out of phase with each other 301 and 302 (CLK1 and CLK0). The data sampled by each edge of CLK1 is shown at 304 (SMP1) while the data sampled by each edge of CLK0 is shown as 305 (SMP0). Looking at points 307 (A) and 308 (B), the SMP0 value is used for data as the prior data value is a zero moving to a one at A while the SMP0 value is used for data as the prior value is a one moving to a zero at B. Note that the duty cycle distortion causes erroneous data values sampled by CLK1 (SMP1) at points A and B.

Figure 4:
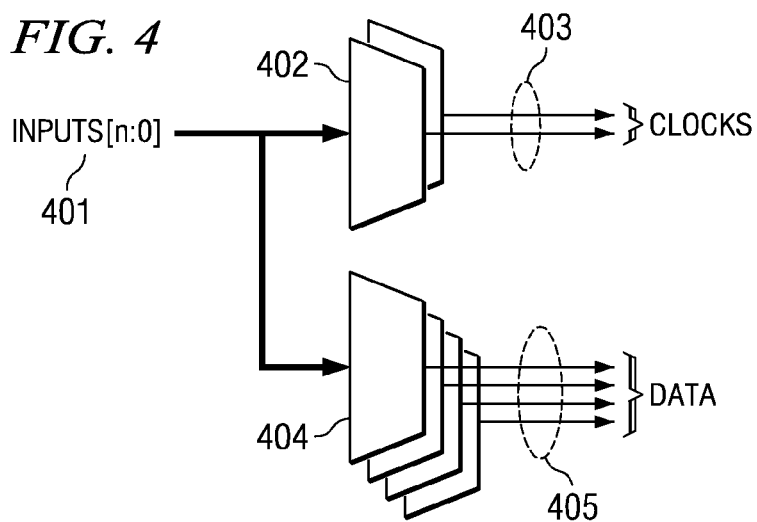
FIG. 4 shows clock source selection.
Figure 5:
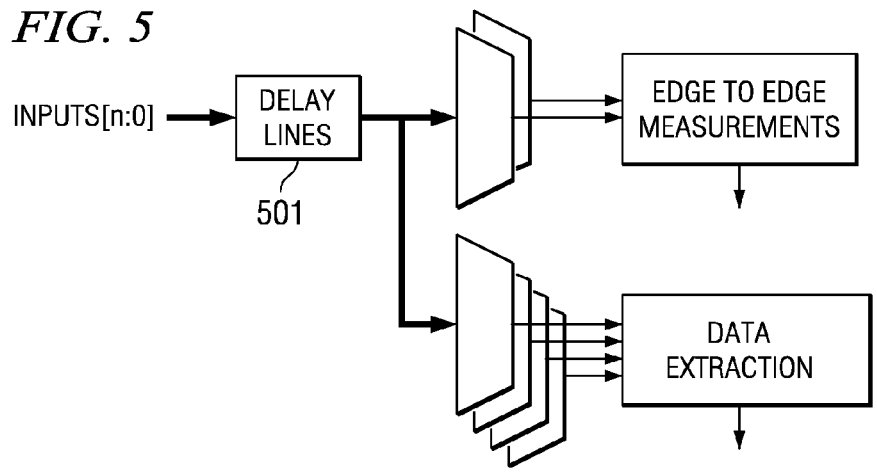
FIG. 5 shows input delay lines.

A single trace receiver may be used to record trace data from multiple trace transmitters. It may also be used to accept trace data from a cascaded trace unit, receiving data from another unit. In the example shown in FIG. 4, each input 401 may be used as either clock 403 or data 405, as selected by logic blocks 402 and 404. This allows any of the inputs to be assigned as a clock and all other inputs as data, or other channels. The trace channels that supply clock(s) and data may supply channels that are skewed. At times there is a need to de-skew clocks when multiple clocks are used. There is also a need to de-skew data inputs to a clock. As shown in FIG. 5, delay lines 501 are added within the trace receiver of FIG. 4 to provide for alignment of clocks to each other and clocks to data. Skew between data bits and data and clock may drift over time and can change with temperature.

This skew may be adjusted in a dynamic manner by using two data extraction circuits to accomplish dynamic recalibration. Two separate data paths are created from the same inputs. Both paths are initially calibrated (de-skewed). One circuit is used as the data path after initial calibration. The second circuit is operated in parallel with the first circuit. The skew of the second circuit is adjusted while the channel operates by comparing the data extracted by the two extraction circuits. Once the second circuit is calibrated, its function is changed to the data path with the data path circuit being changed to the calibration path. This process continues at a slow rate as the drift is slow.

Adaptive calibration of input sampling may be implemented to increase the robustness of the system. At very high data rates, the very small sampling windows may drift because of temperature over long periods of time. Adaptive calibration provides a mechanism to identify approaching marginal setup and hold time situations for the capture circuit creating the data sent to trace channels. Two copies of the data capture logic are used to create a collection and calibration copy of incoming data bits. By capturing the data with the same clocks and data sourced from different delay lines, it is possible to measure whether adequate data setup and hold time margins are being maintained. This is accomplished by alternately moving the delay of the calibration delay line before and after the delay setting of collection delay line. The data values captured by the collection and calibration circuits are compared for mismatches when the collection data is passed to the channels.

If a mismatch occurs, the setup-time or hold-time margin of the collection data capture is identified. The calibration delay line is adjusted until data comparison errors or detected or the calibration delay line adjustment has reached its extreme. Since the delay lines can be calibrated so that the delay of each tap is known, and thermal drift is measured using an extra delay line, the trace software can adjust the collection delay setting to optimize the sampling point of the collection capture circuit.

The collection and calibration data streams are compared. The failures are recorded separately for collection data a one and calibration data a zero. A more complete representation of the skew characteristics is provided with this approach. The application software makes adjustments in the collection skew delay when it determines the collection sampling point can be moved to provide more margin.

Figure 6:
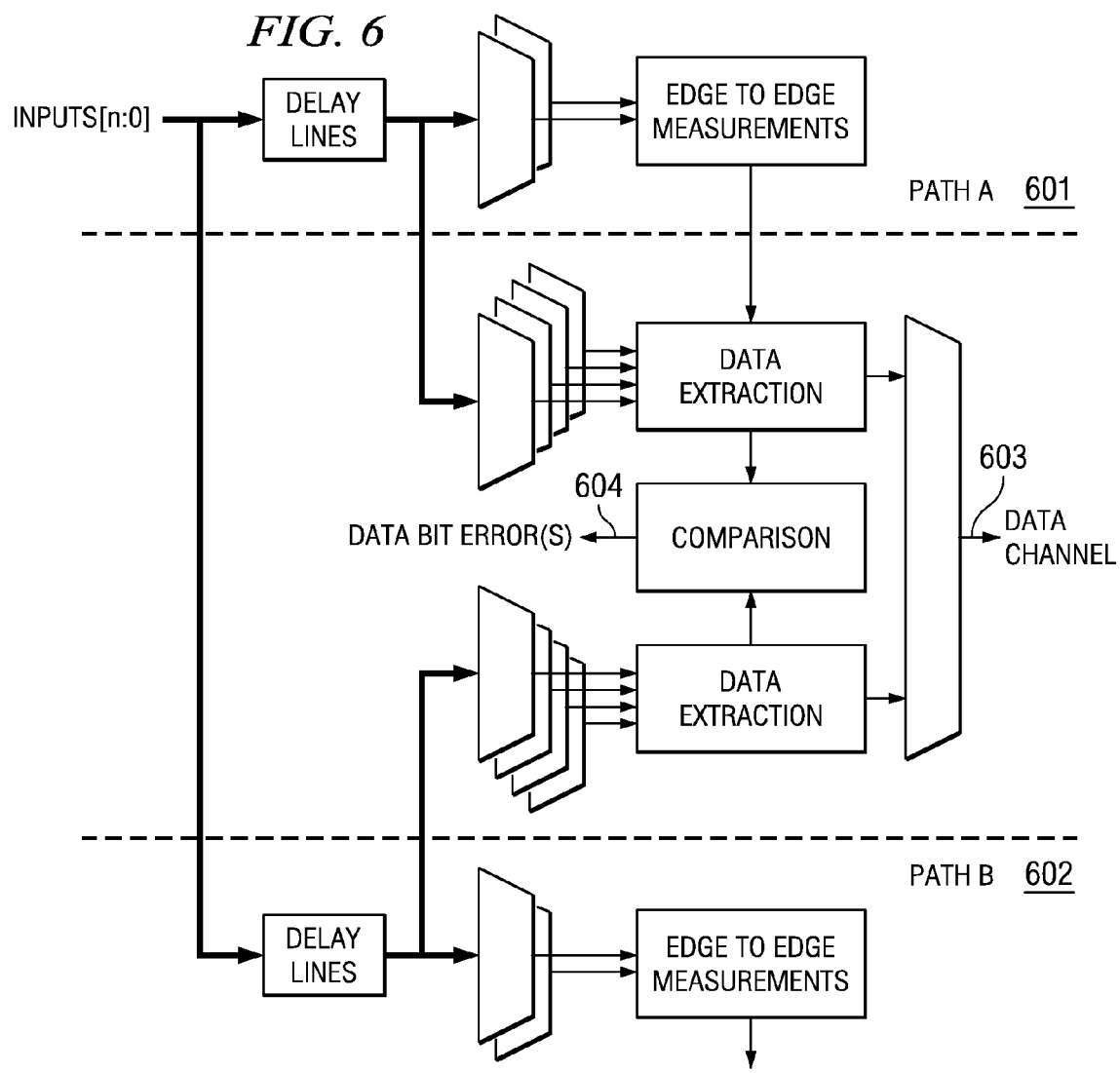
FIG. 6 illustrates dual channel operation for skew adjustments.

In the example shown in FIG. 6, there are two separate data paths 601 and 602 (A and B). During operation, the skew between data bits may change because of thermal changes. Both Path A and B are calibrated when the channel is activated. When the channel operates, either Path A or Path B is selected to generate channel data 603. The path not selected processes the same inputs as the path selected. Since the channel is operating, the data pattern is not known. The data extracted from the two channels is compared in block 604 as the delays are adjusted on the path not selected. The optimum sampling points are found for this path. This calibration may take a long time, maybe as much as several minutes. Checks that assure data with ones and zeroes has been passed through the channel are used to assure the path is properly exercised through calibration. Once calibration of the path not selected has been completed, the roles of the two paths are reversed, with the path supplying data to the channel turned into the calibration path at the same time the calibration path is changed to the data source for the channel.

Figure 7:
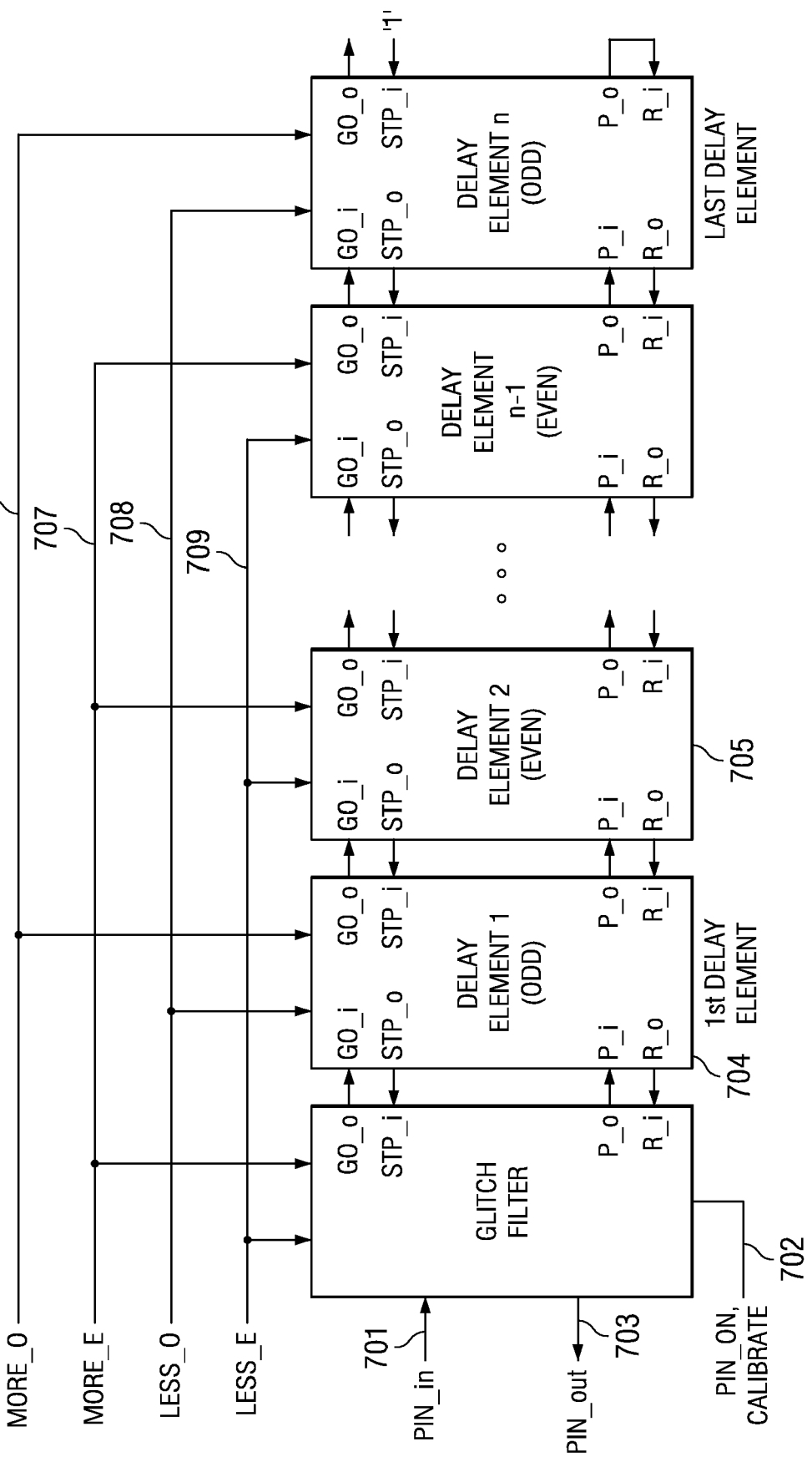
FIG. 7 shows the digital delay lines.

In order to implement the calibration algorithms, a very long digital variable delay line is required, with minimal distortion. FIG. 7 shows an implementation of such a delay line.

The delay line has two inputs, normal 701 (PIN_in) and calibration 702 (Calibrate)) as shown in FIG. 7. Either input or neither input may be selected. When neither input is selected, the delay line may be flushed with a level.

The calibration input is used to configure the delay line as a ring oscillator while the PIN_in is the signal that is normally delayed. Signal 703 (PIN_out) is the delay line output.

Two delay elements are shown, one designated as 704 (odd) and another designated as 705 (even). The odd element is controlled by signal 706 (MORE_O) and 708 (LESS_O) control inputs while the even element is controlled by the 707 (MORE_E) and 709 (LESS_E) control inputs. The symmetry of the circuit and input connectivity of the cascaded elements provides extremely low distortion for delays as long as 10 nanoseconds.

Figure 8:
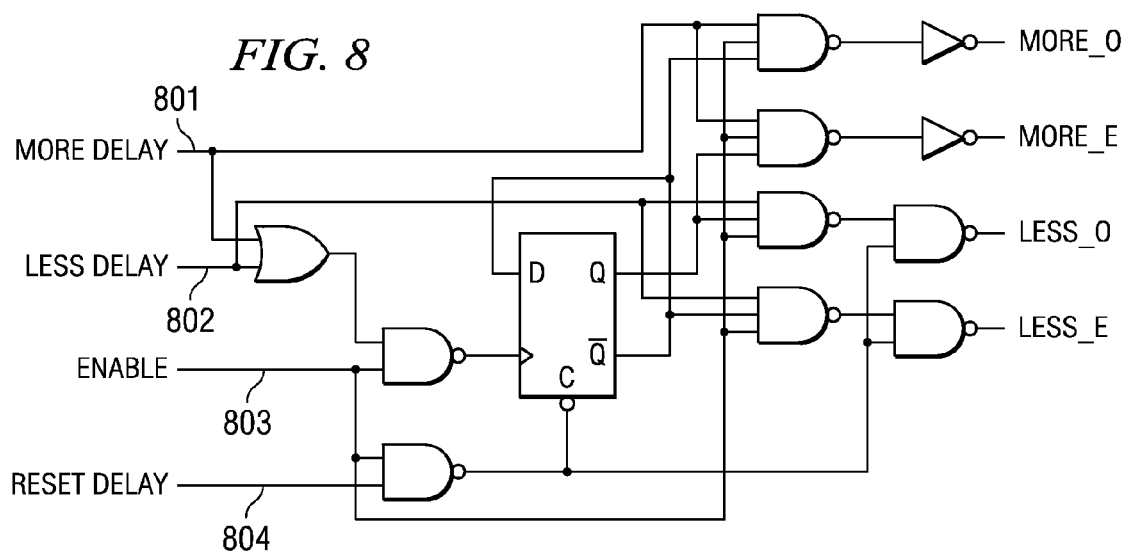
FIG. 8 shows the delay line control signals.

The skew delay is initialized to the minimum when the input is disabled via the MODE codes associated with the input. As shown in FIG. 8, the delay is increased with the MORE DELAY command 801, and decreased with the LESS DELAY command 802. As shown in FIG. 8, these commands generate MORE_E or MORE_O depending on the last ring control command issued as shown in Table 1. Enable signal 803 enables or disables the control circuit, while Reset signal 804 initializes the delay line settings.

TABLE 1

| Command | Last Update | Current Update |
|---------|-------------|----------------|
| MORE | MORE_E | MORE_O |
| MORE | MORE_O | MORE_E |
| MORE | LESS_E | MORE_E |
| MORE | LESS_O | MORE_O |
| LESS | LESS_E | LESS_O |
| LESS | LESS_O | LESS_E |
| LESS | MORE_E | LESS_E |
| LESS | MORE_O | LESS_O |

The number of delay elements included in the delay line is controlled by a master slave like shift register mechanism built into the delay element. The Control State of each element is stored locally in an R-S latch. Adjacent cells (even and odd) have different clocks updating these cells. This means the control state latches can be used like the front and back ends of a Master Slave FF. When the cells are connected together they form a left/right shift register. The MORE_O and MORE_E signals are generated by control logic external to the delay line. These signals cause the shift register to shift right one bit. Only half the cells are updated at any one time. A cell that was last updated with a right shift will contain the last one when the shift register structure is viewed from left to right. When the opposite set of cells is updated, a one is moved into the cell to the right of the cell that previously held the last one. This process continues as MORE_E and MORE_O are alternately generated. The circuit looks like a shift register that shifts right filling with ones. The latch implementation is chosen as it is smaller than one done with conventional flip flops.

The LESS_O and LESS_E signals cause the shift register to shift left one bit. Again, only half the cells are updated at any one time. A cell that was last updated with a left shift will contain the last zero when the shift register structure is viewed from right to left. When the opposite set of cells is updated, a zero is moved into the cell to the left of the cell that previously held the last zero. This process continues as LESS_E and LESS_O are alternately generated. The circuit looks like a shift register that shifts left, filling with zeros.

When a LESS directive follows a MORE directive, it will update the same set of delay elements as the MORE directive. When a MORE directive follows a LESS directive, it will update the same set of delay elements as the LESS directive. This is shown in Table 1.

Digital delay lines may be used to provide fixed delays within circuits. These delays may need to be a specific time value. To get a time value, the number of delay elements needed to create the delay must be chosen. This requires the delay of each delay line tap be determined. The ability to determine this delay in a precise fashion is described. It is not sufficient to just turn the delay line into a ring oscillator as minimal setting will create an oscillator that runs too fast to be measured easily.

Figure 9:
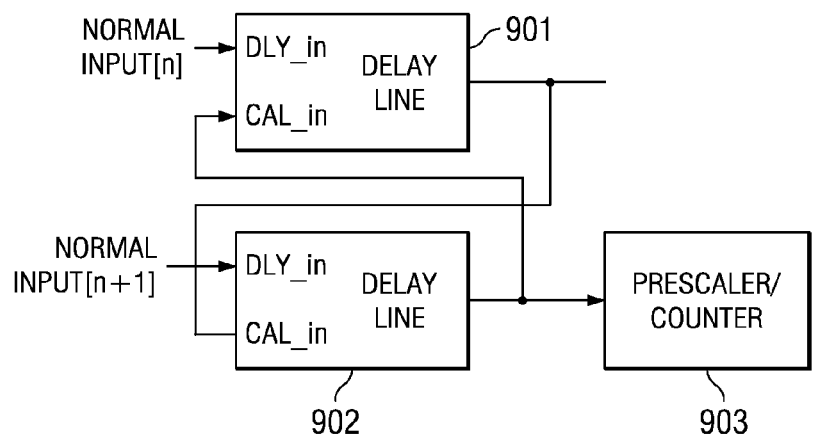
FIG. 9 demonstrates delay line cross coupling.

In the implementation shown in FIG. 9, delay lines 901 and 902 are cross coupled. After both delay lines are cross coupled, they are cleared. With one delay line at full length, the other delay line length is changed one tap at a time with the cross coupled delay lines functioning as a ring oscillator. The ring oscillator increments counter 903 once released. The counter is cleared before the delay line is enabled as an oscillator. After a certain period of time the counter is stopped, and the frequency determined. The difference in frequency when a tap is added gives the delay of the delay line tap.

Figure 10:
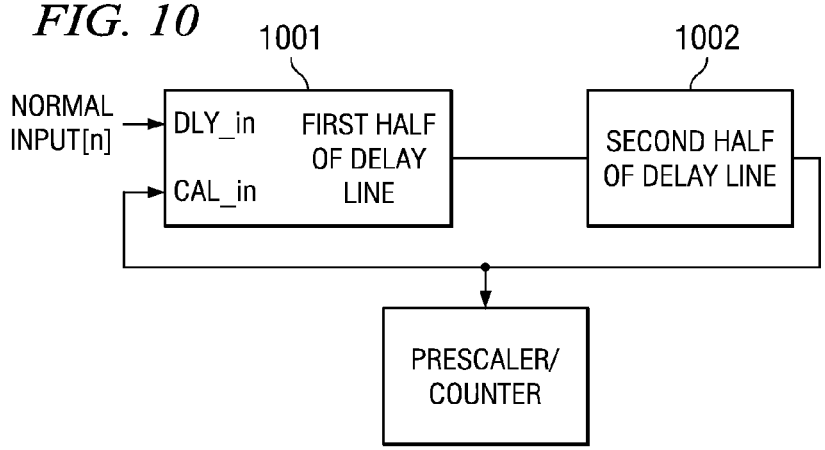
FIG. 10 illustrates tap measurement with a split delay line.

The same approach may be used with a single delay line as it may be split in half to appear as two delay lines 1001 and 1002 as shown in FIG. 10. The delays generated by the taps in one section are determined while the other section's delays are held static.

A trace data source may output trace packets in a width that is not native to the packet. For example, 8 10-bit trace packets may be transmitted as 10 8-bit transmission packets. On the receiver end, the 8-bit transmission packets may be packed into 16-bit, 32-bit, or 64-bit values and stored in trace memory. Any other word with is also acceptable.

The function that performs the packing of a series of M-bit values into P-bit frames to be stored in memory is called a Packing Unit (PU). In one implementation, the PU stores a number of trace transmission packets in 64-bit words called PWORDs. These trace packets are conveyed to the PU through trace transmission packets that may be a different width than the native trace packet. In this implementation, the PU accommodates trace packet widths of 1 to 20 bits. Other widths are possible. The PU is presented a 48-bit input created from two 24-bit sections. The PU uses the data even valid (DE_VALID[n]) and data odd valid (DO_VALID[n]) indications to determine when sections of the input need processing. The Packing Unit processes the data frame based on:

Transmission packet width

Number of buffer entries in the 48-bit input (0, 1, or 2 transmission packets available)

Number of transmission packets processed previously

A lookup table is used to map the incoming transmission packets in the input frame into the 64-bit words. It is programmed before a trace recording session begins based on the factors noted above. This processing creates 64-bit packed words (PWORDs). These words are then stored in trace memory.

In this example, the programmable implementation of a packing unit provides for the packing of any transmission width from 1 to 23 bits into PWORDs from 1 to 63 wide. The Packing Unit uses a lookup RAM to define the packing sequence of a series of trace packets that appear in the 48-bit data frame output from one of the AUs. When one works through examples of varied transmission packet and PWORD widths, it is found that the width of the PWORD (less than or equal to 63 bits) determines the programming depth of the lookup RAM.

The PWORD width is set to an integer multiple of the trace packet width. For a 10-bit trace packet the recording word width is set to 10, 20, 30, 40, 50, or 60 bits. For a 9-bit trace packet width is set to 9, 18, 27, 36, 45, 54, or 63 bits and so forth.

Let us assume a 4-bit element and a 63-bit recording frame. In this example, the number of recording frames built from the 4-bit input segments is defined by the recording frame width. In other words, the example builds four 63-bit words from 63 4-bit input values. If the input data width is five bits with a memory word width of 63-bits, five 63-bit words are built from 63 five bit input values.

If the number of words built and the recording word width have a common factor, both numbers can be divided by this factor. In the example of a 10-bit element and a 60-bit recording frame, the common factor is 10. This means the frame builder can construct one 60-bit word from six 10-bit elements. The relationship between number of words, recording width, and element width is defined by the following equation:

X words can be constructed from Y elements where:

X=Element width/common factor

Y=recording width/common factor

The lookup table must be programmed to the point it repeats (Y locations). A 6-bit register value is used to define the length of the packing sequence before it repeats.

There is a separate lookup table for each of the 64 recording word bits. These lookup tables specify the input to PWORD bit mapping during the mapping sequence. An extra lookup table output bit is added to the table for bits 21:00 as these bits can straddle one of two PWORDS. The extra bit further defines the PWORD associated with this bit. Bits 62:22 do not need this bit so it is not implemented.

This results in a 64×7 bit (for PWORD bits 21:00) and a 64×6 bit lookup table (for PWORD bits 62:22). The lookup table specifies the mapping of the input bits (transmission frames) to the PWORDs each clock. The address to these lookup tables begins at zero and is incremented once for each transmission packet processed (0, 1, or 2 each clock). The address generation for a recording channel lookup RAM is defined by the following expression:

```
if(address + number of elements >= maximum + 1) {next
  address = 1}
    else if(address + number of elements > maximum)
    {next_address = 0;}
      else {next_address = address + number of
      elements;}
```

The address generation is handled by a dedicated hardware block that uses the number of valid transmission packets in the input frame and the end of sequence value. The Bit Builders use the address to drive a 64 lookup random access memories (RAMs), one for each of the 63 bits in the PWORD and a 64th to define when PWORDS are completely constructed. The tables within the lookup RAMs select the bit in the 48-bit input that is to be loaded into each PWORD bit. The Multiplexer Lookup RAMs are organized as 16 64×32-bit RAMS (not all bits are implemented), each RAM supplying the multiplexer control for four bits.

The address generation for the multiplexer control lookup tables increments the address by 0, 1, or 2. The wrap address is set through a register before activating the unit. The address generation begins at zero and progress from there, with the signals indicating available transmission packets driving the address generation.

While a typical trace receiver records from one input port, bandwidth requirements may dictate the use of multi port input trace receivers capable of recording on multiple channels. Such a multiple port, multiple channel receiver is shown as an example in FIG. 11, where multiple recording interfaces 1101–1102 connect to multiple recording channels 1103, 1104, 1105 and 1106 in a selectable manner so that input from each recording interface may be assigned to any recording channel 1107 through 1110. While FIG. 11 shows a two input, four channel system, there is no limitation on the number of inputs or channels.

In the interest of increasing bandwidth, recording may be time division multiplexed between the available recording channels. FIG. 12 shows such a trace receiver with multiple recording interface 1201 connecting to multiple recording channels 1202. A multiple clocks with offsets are used to direct the input data to the desired port.

Typical trace recorders control trace recording by starting and stopping recording at the source. This is done using gated clocks or an enable. With the advent of more sophisticated transmission methods, the recording control point may be moved to a point past the front end, much closer to the memory interface. The trace receiver front end is synchronized to chip transmission and remains synchronized, while the actual on/off control takes place at the memory interface. This allows the input to continue to operate while the data is either presented to the memory interface or may be discarded without affecting input data synchronization.

In a typical system, the trace is being recorded by an external device. The trace function may be treated as a peripheral of the device being traced. As shown on FIG. 13, a trace receiver 1301 is attached to the device 1302 being traced through a trace port 1303 and bus 1304. The trace device records activity through the trace port 1303, and may be programmed or the recorded data retrieved through bus 1304.

The trace function may be implemented on a development board as a trace chip shown in FIG. 13. In an alternate implementation the trace capability may be placed on a small add on board.

It is desirable to be able look at trace information without halting trace recording. It is also preferable to be able to use the trace buffer as a large FIFO for data where the collection rate is less than the rate the host may empty the trace buffer.

Host transfers to and from trace memory while additional trace data is stored are called Real-time Transfers (RTTs). RTTs can take two forms:

Chasing the most recently stored data (forward reads that progress from the start of buffer toward end of buffer)

Snapshot the most recently stored data (reverse reads that progress from the end of buffer toward start of buffer)

When a RTT is initiated, the command causes the initial memory address for a host memory activity to be dynamically generated from the current trace buffer address. For real-time reads, a read command dynamically generates the initial transfer address. For reads where the read direction is opposite that of store direction, the last stored address is used for the initial read address. For reads where the read direction is the same as that of store direction, the next store address is captured, assuming the buffer is full.

Trace buffers can be stored or read either forward or backward. Reads while the channel transfer is stopped are called Static Reads. Static Reads provide access to the entire trace buffer contents without the threat of the data being corrupted by subsequent stores. The storing of new data is suppressed by turning the channel off prior to performing a read. The debug software for this type of read specifies the initial transfer address. Static Reads can read the buffer forward or backward.

Since the trace buffer is circular, a read command can cross the start or end of buffer address. The hardware manages the buffer wrap conditions by resetting the address to the starting buffer address or ending buffer address as required. This may also be done by software.

When the data is read from the most recently stored data to the least recently stored data, the transfer is assumed to have two components. The first component is created from the current buffer address to the start address and second created from the end buffer address to the current buffer address.

When the data is read from the least recently stored data to the most recently stored data, the transfer is also assumed to have two components. The first component is created from the current buffer address to the end address and second created from the start buffer address to the current buffer address.

For the reads from the most recently stored to the least recently stored data, the read processing proceeds as follows. A transfer incomplete error is set if the read terminates before the desired number of words is read. This is caused by a wrap condition occurring on real-time reads (new stores have overwritten data that was to be read creating a discontinuity in old and new data). A no data error is set if no data has been stored in the buffer.

Care must be taken to detect when the data being read is overwritten by data being stored in the case of real-time transfers. This condition may be detected with a collision counter. This counter detects two overrun conditions:

Data is stored with incrementing/decrementing buffer addresses, data is read with decrementing/incrementing buffer addresses. The number of words stored plus the number of words read is equal to the buffer size. (Peek)

Data is stored with incrementing/decrementing buffer addresses, data is read with incrementing/decrementing buffer addresses. The number of words stored minus the number of words read is equal to the buffer size. (Chase)

These overrun conditions are detected using a Collision Counter. This counter is used to determine the distance between the read and write pointers of the Trace Buffer. When this distance becomes zero, a buffer wrap condition is eminent (some accesses may still be in the pipeline and may not have actually happened yet). Before the Collision Counter has decremented to zero, each word read is valid as it was definitely read before new data is stored in this location. A second Valid Transfer Counter, is incremented for each word read before the Collision Counter decrements past zero.

The Collision Counter is loaded with the trace buffer size prior to a host transfer. Once the host transfer request is issued, each trace word stored decrements the collision counter. Each word the Transfer Counter stores in the temporary buffer as a result of the channel read request also counts the counter down. When the sum of the two counts decrements past zero, the data read becomes suspect as a wrap condition has occurred or is on the verge of occurring.

Before the Collision Counter decrements to zero, the Valid Transfer Counter tracks the number of reads that are successful prior to the Collision Counter decrementing past zero. When the transfer completes, Debug Software uses the Valid Transfer Count value to determine how many of the words in read buffer are really valid.

The chase operation has two components:

Counting the words stored to the buffer and notifying the host

The host initiating reads to retrieve the words after being notified

Once a chase operation is requested, channel stores decrement the Collision Counter and TC stores associated with the channel increment the Collision Counter. Since trace data stores have higher priority, the counter will never count up past the buffer size. An overrun condition occurs when the channel stores decrement the counter past zero. When this occurs, the channel store has stored the entire buffer without the host emptying it. Host reads will read out of order data in this situation.

At this point another counter, the Store Counter, comes into play. This counter is used to notify the host when a fixed number of words are stored beginning with the point the read request is issued (an interrupt may be generated). The interrupt interval may be made programmable. Once a transfer has been activated, it merely suspends when words are read. A read may be restarted by merely continuing the read from where it paused. Read continues to pause until either terminated with a TERMINATE or INITIALIZE command.

The overrun condition is detected with the Collision Counter just as with peeks. The counter starts with the buffer size and is decremented by stores and incremented by and TC stores related to the channel read transfer.

Figure 14:
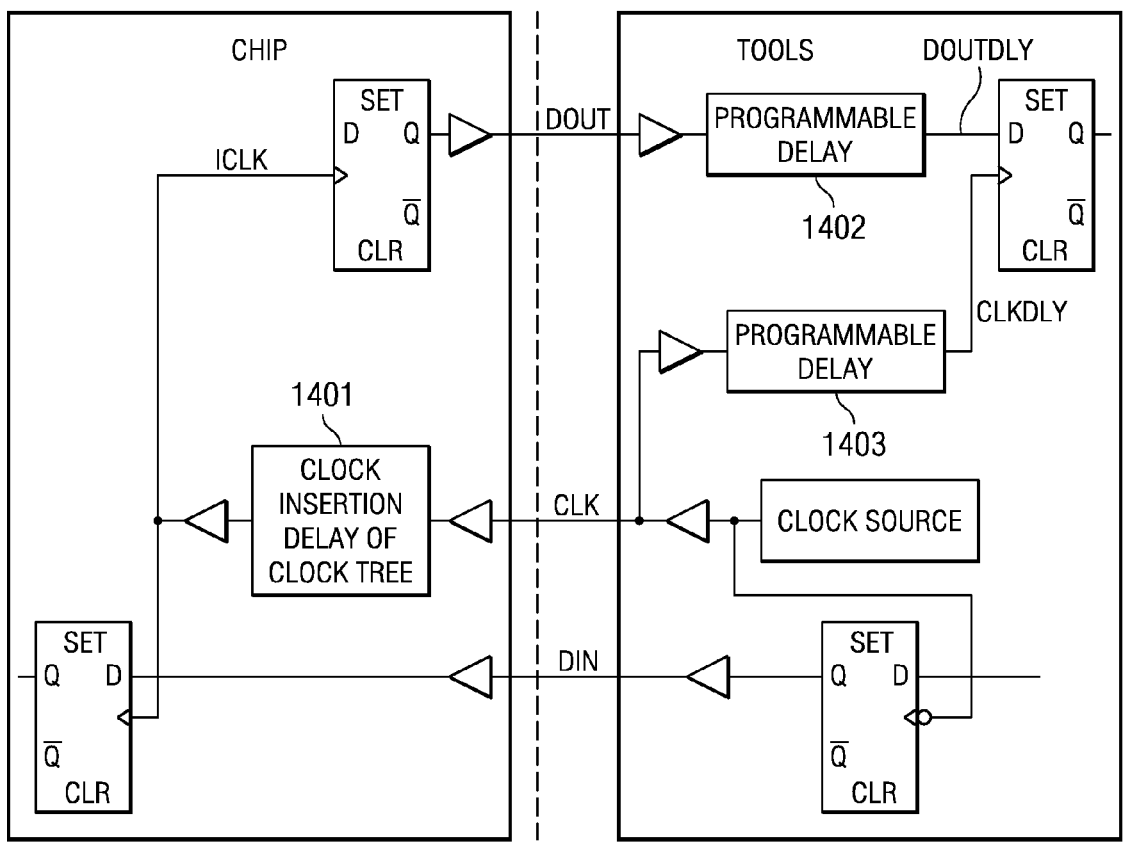
FIG. 14 shows clock insertion delay cancellation.

The master slave timing of interfaces coupled with clock insertion delays of devices causes slower performance as the insertion delay comes directly out of the sampling window. As shown in FIG. 14, programmable delays 1401 and 1403 can be added to the clock and 1402 to the data that allows optimization of timing. The delay may be adjusted dynamically during operation to optimize performance. Scan rates and other transfers may be accelerated by as much as a third when the clock insertion delay is cancelled.

With traditional trace recorders such as logic analyzers, a time stamp is recorded in parallel with each sample stored into trace memory. Each trace sample corresponded to a cycle of system activity. With today's trace implementations on chip, the trace information does not represent a cycle of system activity. Instead a trace word may be an encoded view of many cycles of system activity. Additionally, on-chip trace export mechanisms may schedule output from multiple sources out of order of execution. This makes the exact arrival of trace information in the receiver imprecise.

Instead of using the traditional method of adding Time of the Day (TOD) or Time Stamp (TS) information to trace for every sample, this information may be placed in the trace stream itself and represented as a control word. This may be done periodically or at the first empty slot after some period has elapsed.

By partitioning trace logic to free run while functional logic is clock stepped, the device state of interest may be exported as trace information. When the trace generated by a single functional clock is exported, another functional clock is issued generating more trace information. The functional clock rate is slowed to a rate necessary to export the state of interest.

Figure 15:
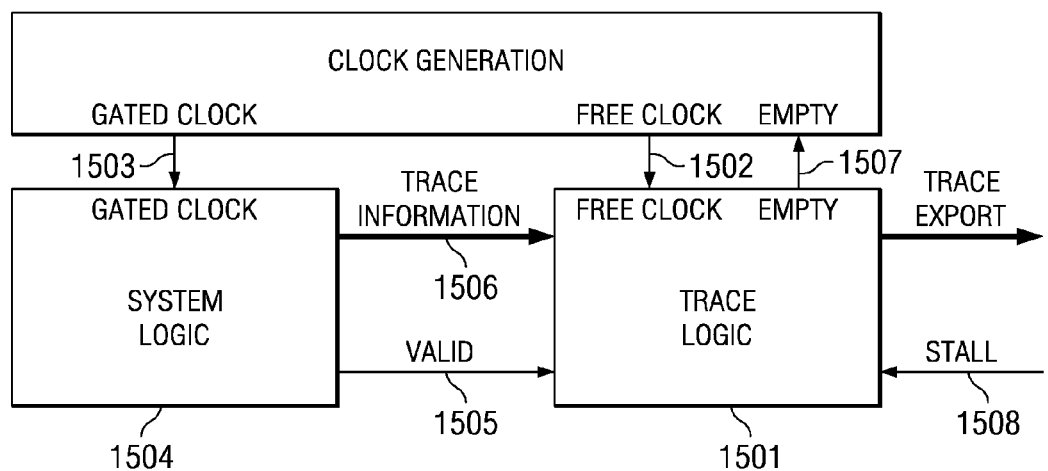
FIG. 15 is a block diagram showing scaled time simulation.

The operation of scaled-time simulation is relatively straight forward as shown in FIG. 15. When a chip is built with trace, the trace logic 1501 is supplied clocks 1502 which are separate from clocks 1503 that normally run the system logic 1504. This allows the chip to be placed in a special mode where the functional logic is issued one clock. One frame of trace data is generated for each functional clock issued. The valid signal 1505 may be implemented as a toggle, changing state when new information is generated. The Trace Logic 1501, whose clock is free running, detects a change in state in the valid signal. It processes the trace information presented to it, exporting this information 1506 to a trace recorder. When transmission of this information has created sufficient space to accept a new frame of trace information, the Empty signal 1507 is generated. This causes the clock generation logic to issue another clock to the System Logic. This starts the process over. An optional stall 1508 may be generated by the Trace receiver so it may pace transactions.

Generally, a trace receiver built with a programmable component, or potentially with another technology (standard cell or ASIC) may, for bandwidth reasons, have a limit as to the width of incoming trace data that can be processed. This is due to the fact that the incoming data rates may outstrip the ability of the receiver to store the data to memory. At times parallel input units may be deployed to capture some portion of the input. The assignment of more than one input channel to a unit can constrain the number of bits that can be processed in parallel. For instance doubling the data rate of the input and using two input channels to process the input in an interleaved fashion, the unit's memory band width or some other factor may require the input width of the incoming data to be constrained to a level than can be handled by the unit.

The simplest way of dealing with an input capacity problems unit is to place two units in parallel, with each unit recording some portion of the incoming data. In other cases, a wide but slower interface such as a memory bus may be used for recording data, with unused memory BW used to export trace data. In this case the wider interface may also require the use of one or more units for recording.

FIG. 16 demonstrates an implementation of a distributed width architecture. The system logic 1601 connects to trace channels 1602, 1603 and 1604 in parallel. Each channel is supplied a set of controls that re identical, and may be as simple as the trace clock. The data 1608, 1609 and 1610 to be recorded by each unit are different.

When multiple debug tools are connected to a target system it may be desirable for them to coordinate their activities. Examples of the need for coordination may be during trace compression or other functions where supervision by a master recording unit is required, and a master and one or more slave units must be designated. This coordination may need to be close to the physical connection. The coordination may involve wide trace, coordination of execution control, or global triggers. This coordination may take place in a variety of ways, including direct connections between the respective debug units. An alternate way of coordination may employ a connection through the target connector, wherein the debug units communicate with the connector which in turn implements the required interconnections.

It may be desirable to expand the trace recording in the deeper dimension. Generally, a trace receiver built with a programmable component, or potentially with another technology (standard cell or ASIC) may, for bandwidth reasons, have a limit as to the amount of incoming trace data that can be processed. In addition the depth of the trace recording may be doubled when the memory space of two or more units is combined. The simplest way of dealing with a trace depth issue is to place two or more units in series, with each unit recording some portion of the incoming data. FIG. 17 demonstrates this architecture. The system logic block 1701 being traced connects to trace unit 1702, which in turn connects to trace unit 1703 and then to 1704 thus expanding the depth of the trace.

When memory events are traced, the timing stream is used to associate events with instructions and indicate pipeline advances precluding the recording of stall cycles. These events are traced when the PC is traced. The tracing of data trace values may not be possible concurrent with memory events in some event encoding modes that use both the timing stream and data value.

When tracing processor activity, three streams are present: timing stream, program counter (PC) stream and data stream. The timing stream has the active and event information, PC stream has all the discontinuity information, and the data stream has all the detailed information. The various streams are synchronized using markers called sync points. The sync points provide a unique identifier field and a context to the data that will follow it. All streams may generate a sync point with this unique identifier. These unique identifiers allow synchronization between multiple streams. When a sync point is generated we will have the streams generated as shown in Table 2. It should be noted that the context information is provided only in the PC stream. There is no order dependency of the various streams with each other. However within each stream the order cannot be changed between sync points.

TABLE 2

| Timing stream | PC stream | Data stream |
|---|---|---|
| Timing sync point, id = 1 | PC sync point, id = 1 | Data sync point, id = 1 |
| Timing data | | |
| | PC data | Memory Data |
| Timing data | | Memory Data |
| Timing data | PC data | Memory Data |
| | PC data | |
| Timing data | | Memory Data |
| Timing sync point, id = 2 | PC sync point, id = 2 | Data sync point, id = 2 |

Four events will be sent to trace although at any one time only some of those events may be active. Information is sent to trace to inform how many and which events occurred.

A timing stream is shown with 0 being active cycle. A "1" however does not represent a stall cycle. Instead it indicates the occurrence of an event.

Bits [7:0]=00111000 is a timing packet.

A "1" in the timing stream implies there is at least one event that has occurred. The event profiling information will be encoded and sent to the data section of the data trace FIFO.

In the generic encoding method, every event that occurs inserts a "1" in the timing stream. If there are multiple events, then it is possible that many "1" s will be inserted in the stream forming an event group. A single "1" can also be an event group by itself. Event groups that occur in a cycle are separated by one or more "0". The group of "1" s map to the count of events, as outlined in the following table, that occurred with the execute packet. The encoding bits are arranged from MSB to LSB. The total bits required in generic encoding are shown in Table 3. The columns are defined as follows:

Etrace: Total number of Events being traced;
Events: Total events that occurred in that cycle;
Implication: The bits in the stream reflect these events have occurred
Bits: Total bits used for the generic encoding scheme;
E0: Event 0;
E1: Event 1;
E2: Event 2;
E3: Event 3.

Generic encoding should be used when all the events have equal probability of occurring. The user may opt to trace anywhere from 1 event or all four events.

TABLE 3

| Line No. | # Etrace | # Events | Timing [MSB:LSB] | Data [MSB:LSB] | Implication | # Bits |
|---|---|---|---|---|---|---|
| 1 | 1 | 1 | 1 | No bits in data stream | E0 | 1 |

TABLE 3-continued

| Line No. | # Etrace | # Events | Timing [MSB:LSB] | Data [MSB:LSB] | Implication | # Bits |
|---|---|---|---|---|---|---|
| 2 | 2 | 1 | 1 | No bits in data stream | E0 | 1 |
| 3 |  | 1 | 11 | No bits in data stream | E1 | 2 |
| 4 |  | 2 | 111 | No bits in data stream | E0 E1 | 3 |
| 5 | 3 | 1 | 1 | 0 | E0 | 2 |
| 6 |  | 1 | 1 | 01 | E1 | 3 |
| 7 |  | 1 | 1 | 11 | E2 | 3 |
| 8 |  | 2 | 11 | 0 | E0 E1 | 3 |
| 9 |  | 2 | 11 | 01 | E0 E2 | 4 |
| 10 |  | 2 | 11 | 11 | E1 E2 | 4 |
| 11 |  | 3 | 111 | No bits in data stream | E0 E1 E2 | 3 |
| 12 | 4 | 1 | 1 | 00 | E0 | 3 |
| 13 |  | 1 | 1 | 01 | E1 | 3 |
| 14 |  | 1 | 1 | 11 | E2 | 3 |
| 15 |  | 1 | 1 | 10 | E3 | 3 |
| 16 |  | 2 | 11 | 01 | E0 E1 | 4 |
| 17 |  | 2 | 11 | 11 | E0 E2 | 4 |
| 18 |  | 2 | 11 | 000 | E0 E3 | 5 |
| 19 |  | 2 | 11 | 010 | E1 E2 | 5 |
| 20 |  | 2 | 11 | 100 | E1 E3 | 5 |
| 21 |  | 2 | 11 | 110 | E2 E3 | 5 |
| 22 |  | 3 | 111 | 10 | E1 E2 E3 | 5 |
| 23 |  | 3 | 111 | 11 | E0 E2 E3 | 5 |
| 24 |  | 3 | 111 | 00 | E0 E1 E3 | 5 |
| 25 |  | 3 | 111 | 01 | E0 E1 E2 | 5 |
| 26 |  | 4 | 1111 | No bits in data stream | E0 E1 E2 E3 | 4 |

The consecutive "1s" in the timing stream determine the number of events that are active and being reported. The encoding in the data stream can then be used to determine the exact events that are active in that group. The following table gives and example of the encoding and decoding of the events. The bits are filled in from the LSB. The latter events are packed in the higher bits. It is assumed that the encoding is in generic mode in the following example and all four AEG are active. Therefore only lines 12–26 of Table 3 are referenced for encoding and decoding this data. The same data stream is interpreted differently with reference to different timing streams. The (MSB:LSB) column in the data stored in the FIFO. "Lines" is the lines to be referred to in Table 3 with the current timing data. The table highlights the fact that the interpretation of the data stream changes based on the timing stream.

In prioritized mode encoding scheme, lesser number of bits are used for some events while some other events may take up more bits. This enables high frequency events to take up lesser number of bits thus decreasing the stress on the available bandwidth. A classic example of this would be misses from the local cache (high frequency), versus misses from the external memory (low frequency).

A timing stream is shown with 0 being active cycle as before. A "1" however does not represent a stall cycle. Instead it indicates the occurrence of an event.

Bits [7:0]=00111000 is a timing packet.

A "1" in the timing stream implies there is at least one event that has occurred. The event profiling information will be encoded and sent to the data section of the data trace FIFO. The priority encoding of this information is based on the following table. The encoding bits are arranged from MSB to LSB.

The various columns in Table 4 are defined as follows:

AEG: Total number of AEG active;
Events: Total events that occurred in that cycle;
Implication: The bits in the stream reflect these events have occurred;
Bits: Total bits used for the priority encoding scheme;
E0: Event from AEG0;
E1: Event from AEG1;
E2: Event from AEG2;
E3: Event from AEG3.

The consecutive "1's" in the timing stream determine the number of events that are active and being reported. The encoding in the data stream can then be used to determine the exact events that are active in that group. The following table gives and example of the encoding and decoding of the events. The bits are filled in from the LSB. The latter events are packed in the higher bits. It is assumed that the encoding is in prioritized mode in the following example and all four AEG are active. Therefore only lines 12–26 of Table 4 are referenced for encoding and decoding this data. The same data stream is interpreted differently with reference to different timing streams. The (MSB: LSB) column in the data stored in the FIFO. "Lines" is the lines to be referred to in Table 4 with the current timing data. The table highlights the fact that the interpretation of the data stream changes based on the timing stream.

Table 4 shows the encoding for prioritized compression mode. The prioritized encoding can be used if the user has a mix of long and short stalls, or frequent versus infrequent. This method is skewed toward efficiently sending out a specific event. It is slightly less efficient in sending out rest of the events. This encoding scheme should be used for the case where one event either does not cause any stall, or happens very frequently with very little stall duration. The longer stalls can be put in the group that take more bits to encode. The shorter stalls can be put in a group that takes fewer bits to be encoded. An example of this is L2 miss which is a long stall, versus L1D stall which is a short stall.

TABLE 4

| Line No. | #AEG | #Events | Timing [MSB:LSB] | Data [MSB:LSB] | Implication | # Bits |
|---|---|---|---|---|---|---|
| 1 | 1 | 1 | 1 | No bits in data stream | E0 | 1 |
| 2 | 2 | 1 | 1 | No bits in data stream | E0 | 1 |
| 3 |  | 1 | 11 | No bits in data stream | E1 | 2 |
| 4 |  | 2 | 111 | No bits in data stream | E0 E1 | 3 |
| 5 | 3 | 1 | 1 | No bits in data stream | E0 | 1 |
| 6 |  | 1 | 11 | 0 | E1 | 3 |
| 7 |  | 1 | 11 | 11 | E2 | 4 |
| 8 |  | 2 | 11 | 01 | E0 E1 | 4 |
| 9 |  | 2 | 111 | 1 | E0 E2 | 4 |
| 10 |  | 2 | 111 | 0 | E1 E2 | 4 |
| 11 |  | 3 | 1111 | No bits in data stream | E0 E1 E2 | 4 |
| 12 | 4 | 1 | 1 | No bits in data stream | E0 | 1 |
| 13 |  | 1 | 11 | 0 | E1 | 3 |
| 14 |  | 1 | 11 | 11 | E2 | 4 |
| 15 |  | 1 | 11 | 01 | E3 | 4 |
| 16 |  | 2 | 111 | 01 | E0 E1 | 5 |
| 17 |  | 2 | 111 | 11 | E0 E2 | 5 |
| 18 |  | 2 | 111 | 000 | E0 E3 | 5 |
| 19 |  | 2 | 111 | 010 | E1 E2 | 6 |
| 20 |  | 2 | 111 | 100 | E1 E3 | 6 |
| 21 |  | 2 | 111 | 110 | E2 E3 | 6 |
| 22 |  | 3 | 1111 | 10 | E1 E2 E3 | 6 |
| 23 |  | 3 | 1111 | 11 | E0 E2 E3 | 6 |
| 24 |  | 3 | 1111 | 00 | E0 E1 E3 | 6 |
| 25 |  | 3 | 1111 | 01 | E0 E1 E2 | 6 |
| 26 |  | 4 | 1111 | 100 | E0 E1 E2 E3 | 7 |

An example of decoding the streams in the prioritized mode is shown in Table 5. The data stream interpretation changes based on the timing stream.

TABLE 5

|  | MSB:LSB | Interpretation | Lines |
|---|---|---|---|
| Data stream | 001 | — | — |
| Timing example 1 | 011011110 | "1111" in TM => 3 or 4 events active | 22–25 |
|  |  | "01" in Data => E0 E1 E2 | 25 |
|  |  | "11" in TM => 1 event active | 12–15 |
|  |  | '0' left in Data => E1 | 13 |
| Timing example | 000111000 | "111" in TM => 2 events active | 16–21 |
|  |  | "01" in Data => E0 E1 | 16 |

In normal trace, timing stream reflects active and stall cycles. It is also possible to suppress the stall bits, and the stall encoding may instead be replaced with event information. When events are traced, the timing stream is used to associate events with instructions and indicate pipeline advances precluding the recording of stall cycles. This allows the real time tracing of the processor activity without disturbing or halting the processor, and have visibility into the memory system activity with lesser number of trace pins than other approaches.

A timing stream is shown in where a "0" is an active cycle. In normal encoding a "1" can, therefore represent a stall cycle.

Bits [7:0]=00111000 is a timing packet.

Therefore this packet would indicate that there were 3 active cycles, followed by 3 stall cycles, which were then followed by 2 active cycles.

Instead we can now replace the stall information with event information. The stall information will be suppressed. A "1" now indicates the occurrence of an event. Therefore the above packet can now be interpreted as follows:

There are 3 active cycles, followed by some event (encoded in this case with 3-"1's"), which is then followed by 2 active cycles.

The exact encoding is completely user dependent on the protocol implemented. For example if 2 possible events are being traced, they could be encoded as follows:

1->Event 0 occurred

11->Event 1 occurred

111->Event 0 and 1 occurred.

A timing stream is shown in FIG. 1 where a "0" is an active cycle. In normal encoding a "1" can, therefore represent a stall cycle.

Bits [7:0]=00111000 is a timing packet.

Therefore this packet would indicate that there were 3 active cycles, followed by 3 stall cycles, which were then followed by 2 active cycles.

The exact encoding may also be completely user dependent as to the protocol being implemented. For example if 3 possible events are being traced, they could be encoded as shown in Table 6:

TABLE 6

| Timing stream | Comment | Total bits used |
|---|---|---|
| 1 | Event 0 occurred | 1 |
| 11 | Event 1 occurred | 2 |
| 111 | Event 2 occurred | 3 |
| 1111 | Event 0 and 1 occurred | 4 |
| 1111 | Event 0 and 2 occurred | 5 |
| 11111 | Event 1 and 2 occurred | 6 |
| 111111 | Event 0, 1 and 2 occurred | 7 |

The user can change the above encoding based on the fact that the likelihood of events alone as well in combination is equal. Then the above method can be changed to a different method shown in Table 7 where a separate stream can hold the reason for the event:

TABLE 7

| Timing stream | Data Stream | Comment | Total bits used |
|---|---|---|---|
| 1 | 00 | Event 0 occurred | 3 |
| 1 | 01 | Event 1 occurred | 3 |
| 1 | 10 | Event 2 occurred | 3 |
| 11 | 00 | Event 0 and 1 occurred | 4 |
| 11 | 01 | Event 0 and 2 occurred | 4 |
| 11 | 10 | Event 1 and 2 occurred | 4 |
| 11 | | Event 0, 1 and 2 occurred | 4 |

The user may be really constrained on the total bandwidth he has, and may potentially wants to profile the events in two runs. In the first run he may have an implied blocking in the events, and thus send out only one event each time. Once he sees his problem area, the user can then focus on just part of his algorithm, enabling higher visibility in that run. Let us say that event 0 has the highest blocking priority. Then the above encoding can be changed to what is shown in Table 8:

TABLE 8

| Timing stream | Data Stream | Comment | Total bits used |
|---|---|---|---|
| 1 | Not used | Event 0 occurred | 1 |
| 11 | Not used | Event 1 occurred | 2 |
| 111 | Not used | Event 2 occurred | 3 |
| 1 | Not used | Event 0 and 1 occurred | 1 |
| 1 | Not used | Event 0 and 2 occurred | 1 |
| 11 | Not used | Event 1 and 2 occurred | 2 |
| 1 | | Event 0, 1 and 2 occurred | 1 |

If we compare the Tables 6, 7 and 8 the total bits that are used in each case is shown in Table 9:

TABLE 9

| Comment | Table 6 | Table 7 | Table 8 |
|---|---|---|---|
| Event 0 occurred | 1 | 3 | 1 |
| Event 1 occurred | 2 | 3 | 2 |
| Event 2 occurred | 3 | 3 | 3 |
| Event 0 and 1 occurred | 4 | 4 | 1 |
| Event 0 and 2 occurred | 5 | 4 | 1 |
| Event 1 and 2 occurred | 6 | 4 | 2 |
| Event 0, 1 and 2 occurred | 7 | 4 | 1 |

The exact encoding is user dependent, however the point illustrated here is that approach shown in Table 6 works really well for Event 0 if it occurs very frequently, while it takes more bits if events are occurring together. Therefore it gives higher priority for encoding of event 0 and then the priority tapers off for the other events. The approach of Table 7 works really well if all events have an equal likelihood of occurring. It does not take too many bits if all events have equal likelihood of occurring, but loses visibility into the details of the events.

The exact trade-offs between the various encoding schemes can be made based on the architecture and the variations most users are interested in.

The timing stream may be used to capture pipeline advances and recording of contributing stall cycles. These stalls are traced when the PC is traced. The trace of data trace values is not allowed concurrent with stall profiling as that stream is used for holding the reasons for the stalls. In a generic mode encoding scheme, all stall groups take up around the same number of bits.

A timing stream is shown where a "0" is an active cycle. In normal encoding a "1" can, therefore represent a stall cycle.

Bits [7:0]=00111000 is a timing packet.

A "1" in the timing stream implies there is at least one contributing stall group active. At the 1st active cycle after that, the last contributing stall that was active (last stall standing) will be encoded and stored. The encoding of this information is based on Table 8. The information is stored in the data part of the data trace FIFO if required. It should be noted that in this mode, tracing of the data values themselves is disabled. In the following table 10 for example implies LSS group 0.

TABLE 10

| Stall groups | Data FIFO | Generic encoding (Data FIFO) (MSB:LSB) | Implication |
|---|---|---|---|
| 1 | not used | not used | L0 |
| 2 | 1 bit | 0 | L0 |
| | | 1 | L1 |
| 3 | 1–2bits | 0 | L0 |
| | | 01 | L1 |
| | | 11 | L2 |
| 4 | 1–3 bits | 00 | L0 |
| | | 01 | L1 |
| | | 11 | L2 |
| | | 10 | L3 |

Generic encoding should be used when all the events have equal probability of occurring.

In prioritized mode encoding, lesser number of bits are used for some stall groups while some other stall groups may take up more bits. This enables high frequency stall events to take up lesser number of bits thus decreasing the stress on the available bandwidth. A classic example of this would be misses from the local cache (high frequency), versus misses from the external memory (low frequency).

A timing stream is shown where a "0" is an active cycle. In normal encoding a "1" can, therefore represent a stall cycle.

Bits [7:0]=00111000 is a timing packet.

A "1" in the timing stream implies there is at least one contributing stall group active. At the 1st active cycle after that, the last contributing stall that was active (last stall standing) will be encoded and stored. The encoding of this information is based on Table 10. The information is stored in the data part of the data trace FIFO if required. It should be noted that in this mode, tracing of the data values themselves is disabled. In the following table 11 for e.g. implies LSS group 0.

TABLE 11

| Stall groups | Data FIFO | Prioritized encoding (Data FIFO) (MSB:LSB) | Implication |
|---|---|---|---|
| 1 | not used | not used | L0 |
| 2 | 1 bit | 0 | L0 |
| | | 1 | L1 |
| 3 | 1–2bits | 0 | L0 |
| | | 01 | L1 |
| | | 11 | L2 |
| 4 | 1–3 bits | 0 | L0 |
| | | 01 | L1 |
| | | 011 | L2 |
| | | 111 | L3 |

Prioritized encoding can be used if there is a mix of long and short stalls. This method is skewed toward efficiently sending out a specific event. It is slightly less efficient in sending out rest of the events. This encoding should be used for the case where one event either does not cause any stall, or happens very frequently with very little stall duration. The longer stalls can be put in the group that take more bits to encode. The shorter stalls can be put in a group that takes fewer bits to be encoded. An example of this is L2 miss which is a long stall, versus L1D stall which is a shorter stall.

External events can occur can occur on an active or stall cycle. They need to be marked in the stream to indicate the position of their occurrence. The timing stream can be adjusted to send out that information. Some of the restrictions of this mode are:

Any packet can be terminated due to an external event.

The pattern matching and event profiling stream is shown in Table 12. The definition of C3 and C5 changes in these modes.

TABLE 12

| 11 | C1 | C2 | | | Packet 0 [4:0] |
|----|----|----|---|---|---------------|
| 10 | C3 | C0 | | | Packet 1 [6:0] |
| 10 | C4 | | | | Packet 2 [6:0] |
| 10 | C5 | 0 | | 0 | Packet 3 [4:0] |
| 10 | 0 | | | | Packet 4 [6:0] |
| 10 | 0 | 0 | | 0 | Packet 5 [4:0] |

The control bits definition for C0 defining the modes, stays the same as shown in Table 13:

TABLE 13

| C0 | Function |
|----|----------|
| 0 or does not exist | Pattern mode |
| 1 | Pattern type either type "1010" (A) or "0101" (5) |

Mode 1 uses pattern length matching. The basic mode definition stays the same. It has been enhanced such that the timing packet will be sent out also if the event happens to fall at a pattern boundary. In which case, the event will be reported for the last of the pattern match counts.

If the event does not occur at a pattern boundary, the current timing pattern packets are rejected. In parallel with it, the $2^{nd}$ timing packet with the event information is also rejected.

In case an event does occur, however the count is small such that C3 or C5 are not present the packet containing those bits will be forced out with pattern field being all equal to 0. Therefore the following cases exist:

In case of C3=1, if count of "1's" is C1t6gt16, packet 1 will still be forced to come out, however it's value will be 0.

In case of C5=1, if count of "0's" is C1t7, packet 3 will still be forced to come out, however it's value will be 0.

If there is no count of "1's", then the count of "0's" case reverts back to case A.

The interpretation of bits C1, C2, C4 stay the same as before for pattern mode (C0=0). The definition of the additional control bits C3 and C5 is shown in Table 14:

TABLE 14

| Bit | Value | Condition | Function |
|-----|-------|-----------|----------|
| C3  | 0     |           | There is no event after these '1' |
|     | 1     |           | There is an event after these '1' |
| C5  | 0     |           | There is no event after these '0' |

TABLE 14-continued

| Bit | Value | Condition | Function |
|-----|-------|-----------|----------|
|     | 1     |           | There is an event after these '0' |

Mode 2 is defined by a fixed pattern of "10" or "01". In this mode, in case of the occurrence of an event, both the packets will always be sent to ensure that C3 is forced to come out. This is regardless of the count value itself (which is above a basic minimum as outlined before). Therefore this mode works exactly like before.

Mode 3 shows standard timing packets. In this mode, if an event occurs, the 2 continuation packets are followed. This contains the timing index into the timing stream. The event will force this timing packet to come out. If timing index is 0, it indicates that the last valid bit in the last timing packet is a "0". If this bit is a "1", it implies that the last valid bit in the last timing packet is a "1".

Depending on the MSB of the "11" timing packet, this packet has to be encoded differently. If the MSB is a "0", it implies that C1="0". This indicates that the next packet is a continuation of count of "1's". In the next packet, C0=1 puts it is A/5 mode. However, the additional continuation packets breaks it out of the A/5 mode and puts it in external event profiling, standard timing packet. This is shown in table 15:

TABLE 15

| 11 | Timing Bit7 = 0 | | | Timing Bits [6:0] |
|----|-----------------|---|---|-------------------|
| 10 | C3 = 1          | | C0 = 1 | Reserved = "000000" |
| 10 | Reserved[6:0]   | | | Timing index Bit |

If the MSB is a "1", it indicates C1="1". Therefore the next packet is a count of "0's". Forcing C4="0" indicates that the last continue packet is a continuation of count of "0's". A "1" next to C5 in the last packet, breaks it out of pattern match mode and puts it in standard timing external event profiling mode shown in Table 16.

TABLE 16

| 11 | Timing Bit7 = 1 | | Timing Bits [6:0] |
|----|-----------------|---|-------------------|
| 10 | C4 = 0          | | Reserved = "000000" |
| 10 | C5 = 1          | 1 | Reserved[4:0]   Timing index Bit |

The events are inserted into the data stream when they occur.

The decoder, on finding an event in the timing stream, looks at the next event reported in the data stream, thus identifying with complete precision, the exact cycle and PC at which the external event occurred.

Events asynchronous to the processor can arrive at any time, even during stall cycle. These events can impact the state of the processor completely and it is essential to understand their timing.

The timing stream may used to capture pipeline advances and recording stall cycles. Timing stream can be in standard or compressed format. These stalls are traced when the PC is traced. The trace of data trace values is not allowed concurrent with external event profiling as that stream is used for holding the reasons for the external event.

A timing stream is shown where a "0" is an active cycle. In normal encoding a "1" can, therefore represent a stall cycle.

Bits [7:0]=11111000 is a timing packet.

Bits [9:0]=11 implies a timing packet let us say.

If an external event occurred during a stream of "1's", let us say after 3 stall cycles, the above packet could be encoded as shown in Table 17:

TABLE 17

| Control Bits [9:8] | Timing bits [7:0] | Comment |
| --- | --- | --- |
| 11 | 00111000 | "11" control bits reflect the start of a timing packet Timing bits [7:6] are not valid but flushed bits |
| 10 | 00000001 | "10" packet presence reflects that there is an external event timing bits [7:1] are not valid timing bit[0] indicates the last valid bit that was present in the timing packet 00111000 |

To debug control flow, user needs to know which of the predicated instruction executed, and which ones did not. For this the predication event is enabled. While PC trace is on, and the trace is in predication event profiling mode, the trace hardware captures the predication events in each cycle. It inserts this information in to the data logs, and does a right shift such that the data gets compact. The trace window will eventually close, either because tracing has been turned off, or because a periodic sync point is generated, to reset the window. In either of these two cases, the data log may be incomplete, fully packed, or just overflow into the next packet. The issue is, how does the decoder understand the fact that not all, or all the bits, are valid in the data log.

Predication information comes from the CPU to the trace hardware. As this information gets packed in the data logs the decoder can do one-to-one matching of the PC addresses and the predication events, based on the object file. Therefore as shown in Table 18:

TABLE 18

| PC Address | Predicates used in code | Bits put in data log | Data Byte0 | Data Byte1 | Value of register bits |
| --- | --- | --- | --- | --- | --- |
|  | Start of window |  |  |  |  |
| P0 | [A0], [A1] | 10 | ------10 |  | A0 = 0, A1 = 1 |
| P1 | [B1], [A1] | 11 | ----1110 |  | B1 = 1, A1 = 1 |
| P2 | [B2] | 0 | ---01110 |  | B2 = 0 |
| P3 | [B2][B1][B0/A2][A1][A0] close of window | 010110 | 11001110 |  | B2 = 0, B1 = 1, B0 = 0 |
|  |  |  |  | ----- 010 | A2 = 1, A1 = 1, A0 = 0 |
| P4 |  |  |  |  | Not traced |

The packets seen by the decoder will be:
Start sync point with PC address;
Aligning data sync point;
11001110 Data Byte 0;
00000010 Data Byte 1; and
End sync point with PC address P4.
Based on the object file, the decoder can easily reverse engineer this and derive Table 19:

TABLE 19

| Comment | Data bits used | Values assigned |
| --- | --- | --- |
| P0 uses 2 predication bits | 00000010 11001110 | A0 = 0, A1 = 1 |

TABLE 19-continued

| Comment | Data bits used | Values assigned |
| --- | --- | --- |
| P1 uses 2 predication bits | 00000010 11001110 | B1 = 1, A1 = 1 |
| P2 uses 1 predication bits | 00000010 11001110 | B2 = 0 |
| P3 uses 6 predication bits | 00000010 11001110 | B2 = 0, B1 = 1, B0 = 0 A2 = 1, A1 = 1, A0 = 0 |
| Ignores upper bits of the data log | 00000010 11001110 |  |

Since the decoder knows from the object file that how many bits need to be discarded, there is no additional hardware required to send out an index into the data log. Similarly, the bandwidth is saved as well, as no bits are sent to indicate that how many bits in the data log are valid.

To enable visibility, stalls, and other events are embedded in the timing stream along with the active cycles. The PC stream has PC discontinuity information. The data logs are used for storing the reason for the stall or the event as the case may be. This information stored is not fixed width, but is anywhere from 1+ number of bits based on various factors.

The details for the stall or event come to the trace hardware from various sources. As this information gets packed in the data logs the decoder can do one-to-one matching of the events reported in the timing stream and the events in the data logs, as well as the PC based on the timing advances. In the data log detail, each individual detail is separated by a "0". Therefore in the following example, let the packets seen by the decoder be:
Timing sync point;
Start sync point with PC address;
Aligning data sync point;
01000100 Timing packet1;
00010101 Timing packet2;
11001110 Data Byte 0;
00000010 Data Byte 1;
Timing sync point; and
End sync point with PC address P4.
Based on the timing data, the decoder can easily reverse engineer this and derive Table 20:

TABLE 20

| Events detected | Timing bits used | Data bits used |
| --- | --- | --- |
| Event 0 | 01000100 | 11001110 Data Byte 0 |
|  | 00010101 | 00000010 Data Byte 1 |
| Event 1 | 01000100 | 11001110 Data Byte 0 |
|  | 00010101 | 00000010 Data Byte 1 |
| Event 2 | 01000100 | 11001110 Data Byte 0 |
|  | 00010101 | 00000010 Data Byte 1 |

TABLE 20-continued

| Events detected | Timing bits used | Data bits used |
| --- | --- | --- |
| Event 3 | 01000100 | 11001110 Data Byte 0 |
|  | 00010101 | 00000010 Data Byte 1 |
| Event 4 | 01000100 | 11001110 Data Byte 0 |
|  | 00010101 | 00000010 Data Byte 1 |
| Ignores upper bits of the data log |  | 11001110 Data Byte 0 |
|  |  | 00000010 Data Byte 1 |

Since the decoder knows from the timing packets how many events need to have details, there is no additional hardware required to send out an index into the data log. Similarly, the bandwidth is saved as well, as no bits are sent to indicated that how many bits in the data log are valid.

A software pipeline loop is different from other discontinuities, because it repetitive. It also has other issues like the next iteration can start before the first one is complete. Furthermore, it is possible to reload it, and may or may not be reloaded. It can terminate due to an exception. It can be drained in the middle for an interrupt.

The rules for SPLOOP tracing are as follows. If SPLOOP starts do not send out any information at that point. The SPLOOP information can be inferred from the End of SPLOOP packet. If the SPLOOP is skipped, send out information indicating that.

If the SPLOOP is skipped and executed as NOPS the followed packet "NoSP" will be sent out if tracing is already on. If the tracing is started or ended in the skipped SPLOOP, this information will be sent out via special control bitsIn case of SPLOOPD, the condition is always evaluated as true therefore this packet can never be sent in the normal operation.

If the SPLOOP is not skipped, the SPLOOP will be reported at start of the first cycle of the epilog stage and not the final stage of epilog. In case of early exit, the SPLOOP is still reported when the epilog starts, regardless of the prolog still loading. The iteration count (IC) is the count since the last time SPLOOP information was sent, or the position in the SPLOOP if it is a part of a periodic or start/end sync point. Since the periodic counter is 12 bit wide, the IC can be a maximum of 12 wide for ii=1.

The periodic SPLOOP marker (PerSP) will be sent out along with any PC Sync point if the SPLOOP is active. There can be no other information that can be sent between the periodic sync point and the PerSP packet. PerSP will be also sent if data log is being traced and data trace is on by itself.

This packet sends out the exact position in the SPLOOP. It contains the following information:

In the prolog, it sends out the absolute iteration count.

There are a maximum of 7 packets that may have to be sent out.

In the kernel, it just sends out the information that the SPLOOP is in the kernel. The continue packet for the count will not be sent out. The count bits will be reserved to "000" in this case.

This also contains the address of the SPLOOP itself, if the PerSP is being sent out in a reload or a return from interrupt SPLOOP. This is due to the fact that the address on the PC bus coming from the CPU may have an address completely remote from the SPLOOP itself. It may have changed due to a branch in the code fetched from the memory during the previous drain. The PC address in the PerSP can be sign extended.

The periodic SPLOOP marker (PerSP) will be sent out along with any PC Sync point if the SPLOOP is active. There can be no other information that can be sent between the periodic sync point and the PerSP packet. PerSP will be also sent if data log is being traced and data trace is on by itself.

When multiple activities are being profiled, there is the possibility of data corruption due to excessively large amounts of trace data being collected. This may be reduced by forming a logical or of a number of the signals being profiled to determine the area of software of interest. Then a second run may be performed for only the limited parts of the applications which have issues, turning on full visibility this time.

Trace gives full visibility in to the processor activity. One can have a good insight in to what an application is doing, even without an object file. Trace can be turned on and off based on cycle count, giving some information about the secure code. It is imperative that this information should be blocked.

It is assumed that the code will switch to secure code via an exception only. All PC and data trace will be turned off during secure code. This will occur regardless of trace being in standard trace mode or event profiling mode. Timing, if on, will switch to standby mode.

On return from the secure code, the switches that were already on will switch back and turn on.

Once in secure code, none of the streams can be switched, regardless of the streams being currently disabled. TEND is the only trigger that will have any impact in secure code. The address reported in the end sync point, caused by the TEND, will be the address 0x01. Similarly, a TRIGGER in the secure code will also report a sync point with the address of 0x01.

Since the PC address in the sync point is an illegal address of 0x01, therefore this information is sufficient to indicate an end sync point was caused in secure code.

Table 21 shows the sync types can occur. In all cases, data trace being on or off is optional. In case of TEND, when the code switched back to insecure code, the streams will not switch back on.

TABLE 21

| Stream | Event | Sync Type |
| --- | --- | --- |
| PC off, TM off | — | — |
| PC on, TM off | Switch to secure code | End |
| PC on, TM off | TEND | End |
| PC on/off, TM on | Switch to secure code | Stand by mode |
| PC on/off, TM on | TEND | End |
| Stand by mode | TRIGGER | Trigger |

When tracing of data is enabled, the volume of data increases tremendously. The trace output at times cannot keep up with the volume of data that is being generated. There are unique IDs embedded in each of the streams, PC, timing and data to maintain synchronization between them, even though the data logs themselves recover from the corruption, reset the compression map, however, the decoder has no idea, what is the ID of the logs, because multiple IDS may have been lost in the corruption. Therefore, the decoder has to wait till it sees the next set of IDs for PC, timing and data, before it can start decoding again.

A solution is to force the insertion of a data sync point along with the first log after corruption, even if it means repeating the sync point id. The decoder will immediately know the id of the logs after corruption and will not have to throw away the logs, till it comes across the next sync id.

The traditional technique for sending out timing data is by sending out one bit for every active or stall cycle. Typical DSP applications have been found to have specific patterns in the active and stall cycles. Some examples of this would be cross-path stalls, bank conflicts, writes buffer full etc. Instead of sending out the actual pattern, it is possible to send control bits in the stream marking these specific patterns followed by the count of the total times the pattern occurred.

In a timing packet a "0" is an active cycle and a "1" is a stall cycle. Table 22 shows how timing packets can have alternate meaning based on the fact that the first timing packet is followed by not a "11" kind of control bits, but some other bits (in this example "10" bits.

TABLE 22

| Packet Number | Bits [9:8] (Control Bits) | Bits [7:0] (Timing Data bits) | Comment |
|---|---|---|---|
| 1 | 11 | 00111000 | Timing data of packet 1 is raw timing bits where a '1' is a stall cycle, while a '0' is an active cycle |
| 2 | 11 | 01000100 | |
| 1 | 11 | 00111000 | Bits [7:0] of packet 1 is now no longer raw timing data, but could be more control bits if desired, or reflect a different type of data altogether. |
| 2 | 10 | 01000100 | |

The trace stream sends out CPU register information in the trace stream under the following circumstances:

There is a change in the CPU register and any one of the streams are enabled;

There is a sync point due to a stream being enabled, or a periodic sync point and the CPU register is a non-zero value. The sync point will be sent out first followed by the CPU information. In this case the instruction count information will not be sent out.

PC Trace includes the PC values associated with overlays. Without information about the overlays installed at the time the PC trace of overlay execution takes place, it is not the actual overlay being executed cannot be ascertained merely form PC trace information.

Additional information is needed in the trace stream to identify an overlay whose execution of code in a system where overlays or a Memory Management Unit are used. The method for exporting information in addition to the PC is shown in FIG. 18. The block diagram shown in FIG. 18 can be used to add any information type to the PC export stream 1806. In the case of PC Trace, additional information is added when the memory system contents is changed. Information describing the configuration change is inserted into the export stream 1806 by placing this information in a message buffer 1802. A request to insert a message in the stream is asserted by signal 1803 when the complete message is placed in the buffer 1802. Once this request is asserted all words of the message are sent consecutively to the Trace block 1805 and then to the trace stream 1806. As long as a message word is available for output, it becomes the next export word as the output of message words is continuous. Loading the message records the number of message words to be output.

Figure 19:
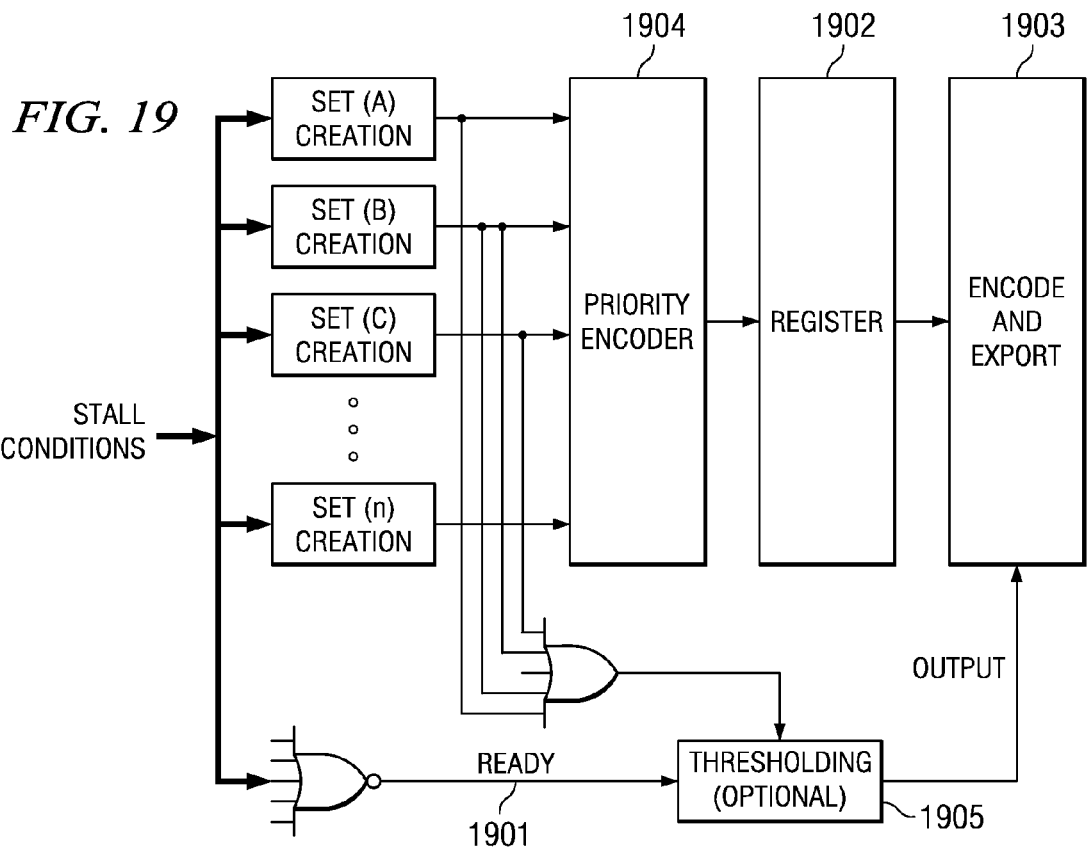
FIG. 19 is a block diagram of a last stall standing implementation.

In a system where power and performance are very important, it is important to allow the developer to understand what system conditions are causing execution to stall. The concept of last stall standing allows the recording of information about what system events or event groups are causing the stall of system execution. The number of stalls attributable to the offending stall condition may also be recorded. FIG. 19 shows an implementation of this concept.

Each occurrence of the ready signal 1901 causes the register 1902 contents to be encoded and exported by block 1903 provided the following conditions are true:

The last stall standing function is enabled;

One of the sets had an element active the last clock cycle;

No stall condition exists this cycle; and

Ready has been inactive a sufficient number of cycles to satisfy the threshold if a threshold is implemented in block 1905.

Stalls conditions can be assigned to any set or no set.

It is therefore possible to move the priority of any stall condition higher or lower using priority encoder 1904.

Last stall standing operation provides a label associated with each stall period that exceeds a specified threshold as determined in block 1905. This allows one to filter out some stall busts, i.e. to preserve trace bandwidth.

Events may be recorded as multi-bit values representing the events or encoded representations of the bits. These multi bit values may vary in width and do not fit the form used for native storage. These event representations can be packed in the format normally used for representing trace data, allowing the sharing of hardware with data trace, including all compression functions.

To provide state accurate simulation, the functional logic itself can be used as a simulation platform. Trace is used to output the internal machine state of interest. Trace is recorded by a unit that controls the pace of trace generation with a pacing signal.

Figure 20:
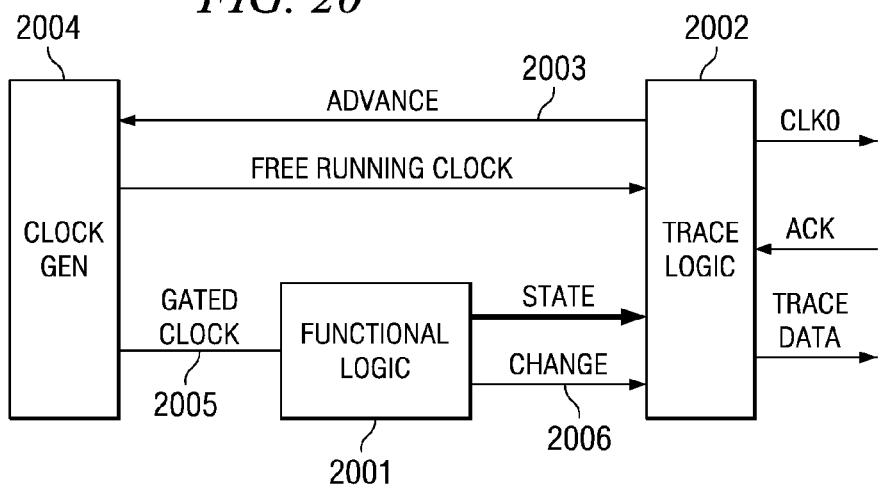
FIG. 20 shows an example of a self simulation architecture.

As shown in FIG. 20 the functional logic is placed in self simulation mode. When the trace logic 2002 does not have any more data to output it changes the state of advance signal 2003. The clock generator 2004 detects this state change and issues one gated clock 2005 to the functional logic. This creates a new CPU state and causes change 2006 to toggle to the trace logic. The trace logic notes the state change in change 2006 and it exports the state presented to it. Once it completes it changes the state of advance 2003 and the process begins anew.

Predication trace is valuable as it details control decisions. A means to support predication trace must minimize the trace bandwidth required to record predication. Predication may involve a number of terms that can be selected for use as the predication value. Not all predication terms are used in these situations. The terms that will be used are defined by the instruction executing. Only the terms used are exported with the unused terms discarded.

Trace data is generally routed to a single recording channel and is not packaged. When packaging of trace from different sources is added, routing information must be provided as packaging is specific to an output channel (destination). In a complex system being traced, there can be multiple trace destinations. With multiple trace data sources, each source may be routed to one of n destinations. A novel way to determine the export routing is to have the source provide the destination of its data to trace merge logic along with its source ID and data. Packing logic uses this routing information to pack the data for delivery to the desired destination, packing this data with other data destined for the same destination.

An alternate way to derive the routing information is to have the source ID to drive a look-up table to determine the destination of the data. This destination information from the look-up is used by the packaging unit to prepare the data for export to one of n destinations.

The internal trace buffers used to record trace information to be exported are, in the previous art designed to record the information, and then have this information read by a host. In order to meet bandwidth requirements, the internal buffer may be operated as a FIFO in the current implementation.

Bandwidth requirements for trace export can be high, and may require dedicated trace pins on the package. These pins may be reduced or eliminated, and the bandwidth requirements reduced by exporting the trace data to the application memory using the standard application busses instead of using dedicated trace pins.

What is claimed is:

1. A method of trace data compression comprising the steps of:
   determining if at least two consecutive trace words are the same value;
   outputting a first trace word;
   determining how many times the said trace word is repeated; and
   outputting a command and a count that communicates how many times the trace word was repeated.

2. A method of data compression in trace recording comprising the steps of:
   determining if at least two consecutive trace packets are the same value;
   outputting a first trace packet;
   determining how many times the said trace packet is repeated; and
   outputting a command and a count that communicates how many times the trace packet is repeated.

3. The method of claim 2, wherein:
   the trace packets are variable width; and
   further comprising converting the trace packets to a different width previous to transmission.

4. The method of claim 3, wherein:
   packing the received trace packets into a different width previous to being stored into memory.

5. The method of claim 4, wherein:
   said step of packing the received trace packets into a different width includes packing the trace packets into a width based upon a look up table, where the look up table is programmed based upon a transmission packet width, a number of entries in the input buffer and a number of transmission packets processed previously.

* * * * *